US012796383B2

(12) United States Patent
Shindo et al.

(10) Patent No.: US 12,796,383 B2
(45) Date of Patent: Nov. 10, 2026

(54) APPARATUS FOR TRANSFERRING SUBSTRATE, SUBSTRATE PROCESSING SYSTEM AND METHOD OF PROCESSING SUBSTRATE

(71) Applicant: Tokyo Electron Limited, Tokyo (JP)

(72) Inventors: Takehiro Shindo, Nirasaki City (JP); Akinori Shimamura, Nirasaki City (JP); Hiromitsu Sakaue, Nirasaki City (JP); Dongwei Li, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 244 days.

(21) Appl. No.: 18/273,446

(22) PCT Filed: Jan. 12, 2022

(86) PCT No.: PCT/JP2022/000747
§ 371 (c)(1),
(2) Date: Jul. 20, 2023

(87) PCT Pub. No.: WO2022/158351
PCT Pub. Date: Jul. 28, 2022

(65) Prior Publication Data
US 2024/0120225 A1 Apr. 11, 2024

(30) Foreign Application Priority Data
Jan. 25, 2021 (JP) ................................. 2021-009861

(51) Int. Cl.
*H10P 72/30* (2026.01)
*H10P 72/00* (2026.01)

(52) U.S. Cl.
CPC ...... *H10P 72/3204* (2026.01); *H10P 72/0402* (2026.01)

(58) Field of Classification Search
CPC ............ H01L 21/67742; H01L 21/677; H01L 21/67748; H01L 21/67196;
(Continued)

(56) References Cited

U.S. PATENT DOCUMENTS 5,905,850 A * 5/1999 Kaveh ............... H01L 21/67259 414/217
5,970,717 A * 10/1999 Tateyama .......... H01L 21/67109 34/433
(Continued)

FOREIGN PATENT DOCUMENTS

JP 2018-504784 A 2/2018
KR 10-2017-0056683 A 5/2017
(Continued)

*Primary Examiner* — Yuechuan Yu
(74) *Attorney, Agent, or Firm* — Nath, Goldberg & Meyer; Jerald L. Meyer; Tanya E. Harkins

(57) ABSTRACT

Provided is an apparatus that transfers a substrate inside a substrate transfer chamber by a substrate transfer module using magnetic levitation. The apparatus includes: a substrate transfer chamber having a floor portion provided with a first magnet and connected, through an opening portion, to a substrate processing chamber in which the substrate is processed; and a substrate transfer module including a substrate holder configured to hold the substrate, and a second magnet configured such that a repulsive force acts between the first magnet and the second magnet. The substrate transfer module is movable inside the substrate transfer chamber by the magnetic levitation based on the repulsive force. The substrate transfer module performs loading/unloading of the substrate by directly entering into the substrate transfer chamber via the opening portion, or delivers the substrate to and from a substrate transfer mechanism fixedly provided inside the substrate transfer chamber.

18 Claims, 31 Drawing Sheets

(58) Field of Classification Search
CPC ......... H01L 21/67017; H01L 21/67709; H10P 72/3204; H10P 72/0402
See application file for complete search history.

(56) References Cited

U.S. PATENT DOCUMENTS

| | | | | |
|---|---|---|---|---|
| 6,395,094 | B1 * | 5/2002 | Tanaka | H01L 21/67184 414/217 |
| 2004/0041421 | A1 | 3/2004 | Hsiao et al. | |
| 2005/0103270 | A1 * | 5/2005 | Yoshida | H01L 21/67772 118/718 |
| 2016/0218029 | A1 * | 7/2016 | Janakiraman | H01L 21/67709 |
| 2017/0331359 | A1 * | 11/2017 | Paweletz | H02K 41/031 |
| 2021/0296150 | A1 * | 9/2021 | Berger | H01L 21/67173 |

FOREIGN PATENT DOCUMENTS

| | | | |
|---|---|---|---|
| KR | 10-2017-0106464 | A | 9/2017 |
| WO | 2019/238416 | A1 | 12/2019 |

* cited by examiner

APPARATUS FOR TRANSFERRING SUBSTRATE, SUBSTRATE PROCESSING SYSTEM AND METHOD OF PROCESSING SUBSTRATE

This is a National Phase Application filed under 35 U.S.C. 371 as a national stage of PCT/JP2022/000747, filed Jan. 12, 2022, an application claiming the benefit of Japanese Application No. 2021-009861, filed Jan. 25, 2021, the content of each of which is hereby incorporated by reference in its entirety.

TECHNICAL FIELD

The present disclosure relates to an apparatus for transferring a substrate, a substrate processing system, and a method of processing the substrate.

BACKGROUND

For example, in an apparatus for processing a semiconductor wafer (hereinafter, also referred to as a "wafer") which is a substrate, the wafer is transferred between a carrier that accommodates the wafer and a wafer processing chamber in which the processing is executed. In transferring the wafer, wafer transfer mechanisms with various configurations are used.

For example, Patent Document 1 discloses a substrate carrier that transfers a semiconductor substrate between processing chambers in the state of floating from a plate by using magnetic levitation.

PRIOR ART DOCUMENT

Patent Document

Patent Document 1: Japanese Laid-Open Patent Publication No. 2018-504784

The present disclosure provides a technique for transferring a substrate by a substrate transfer module by using magnetic levitation inside a substrate transfer chamber.

SUMMARY

An apparatus for transferring a substrate according to the present disclosure transfers the substrate to a substrate processing chamber in which a substrate processing is performed. The apparatus includes: a substrate transfer chamber including a floor portion provided with a first magnet, and a sidewall portion connected to the substrate processing chamber and having an opening portion through which a loading/unloading of the substrate between the substrate transfer chamber and the substrate processing chamber is performed; and a substrate transfer module including a substrate holder configured to hold the substrate, and a second magnet configured such that a repulsive force acts between the first magnet and the second magnet, the substrate transfer module being configured to be movable inside the substrate transfer chamber by a magnetic levitation based on the repulsive force, wherein the substrate transfer module is configured to perform the loading/unloading of the substrate by directly entering the substrate transfer chamber via the opening portion, or in a case in which a substrate transfer mechanism is fixedly provided inside the substrate transfer chamber to perform the loading/unloading of the substrate between the substrate transfer mechanism and the substrate processing chamber via the opening portion, the substrate transfer module is configured to deliver the substrate to and from the substrate transfer mechanism.

According to the present disclosure, a substrate can be transferred inside a substrate transfer chamber by a substrate transfer module that uses magnetic levitation.

DETAILED DESCRIPTION

Hereinafter, an overall configuration of a wafer processing system 100, which is an apparatus for processing a substrate according to an embodiment of the present disclosure, will be described with reference to FIG. 1.

Figure 1:
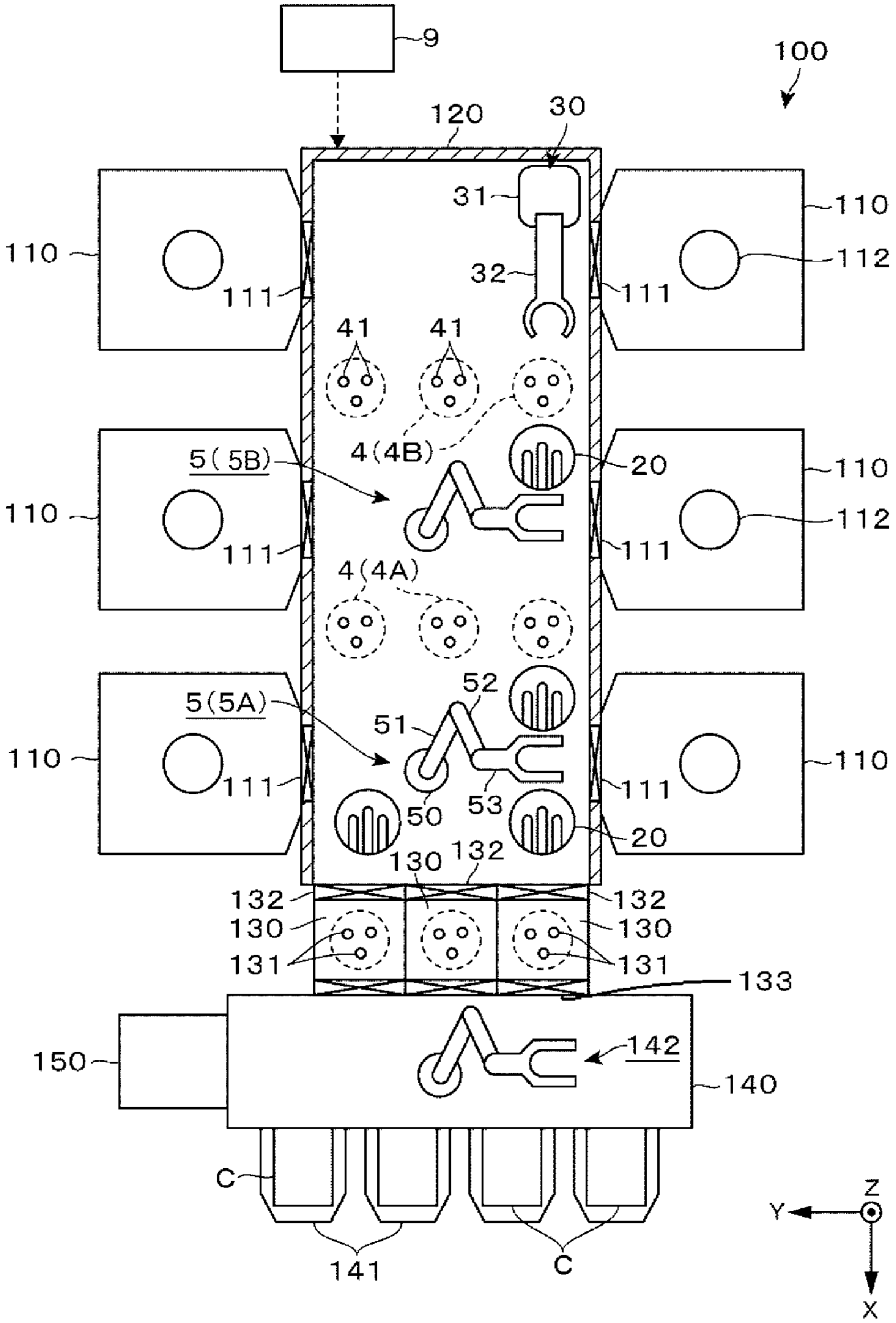
FIG. 1 is a plan view of a wafer processing system according to the present disclosure.

FIG. 1 illustrates a multi-chamber-type wafer processing system 100 including a plurality of wafer processing chambers 110, which are substrate processing chambers for processing wafers W. As illustrated in FIG. 1, the wafer processing system 100 includes a load port 141, an atmospheric transfer chamber 140, a load-lock chamber 130, a vacuum transfer chamber 120, and a plurality of wafer processing chambers 110. In the following description, a direction in which the load port 141 is provided when viewed from the vacuum transfer chamber 120 is defined as a front side.

In the wafer processing system 100, the load port 141, the atmospheric transfer chamber 140, the load-lock chamber 130, and the vacuum transfer chamber 120 are arranged in this order in a horizontal direction from the front side. The plurality of wafer processing chambers 110 are arranged side by side on left and right sides of the vacuum transfer chamber 120 when viewed from the front side.

The load port 141 is configured as a stage on which a carrier C that accommodates wafers W to be processed is placed. Four load ports 141 are installed side by side in the left-right direction when viewed from the front side. As the carrier C, for example, a front opening unified pod (FOUP) may be used.

The atmospheric transfer chamber 140 is kept in an atmospheric pressure (normal pressure) atmosphere. For example, a down-flow of clean air is formed in the atmospheric transfer chamber 140. Inside the atmospheric transfer chamber 140, a wafer transfer mechanism 142 configured to transfer a wafer W is provided. The wafer transfer mechanism 142 in the atmospheric transfer chamber 140 transfers the wafer W between the carrier C and the load-lock chamber 130. In addition, for example, on the left surface of the atmospheric transfer chamber 140, an alignment chamber 150 for performing alignment of the wafer W is provided.

Three load-lock chambers 130 are installed side by side between the vacuum transfer chamber 120 and the atmospheric transfer chamber 140. Each of the load-lock chambers 130 has a lifting pin 131 that pushes up and hold the wafer W loaded thereinto from below. Three lifting pins 131 are provided at regular intervals in a circumferential direction and are configured to be movable up and down. The interior of the load-lock chambers 130 may be switched between an atmospheric pressure atmosphere and a vacuum atmosphere. The load-lock chambers 130 and the atmospheric transfer chamber 140 are connected to each other via gate valves 133. The load-lock chambers 130 and the vacuum transfer chamber 120 are connected to each other via gate valves 132. Boundary portions of the vacuum transfer chamber 120 and each load-lock chamber 130 are connected to each other so as not to form a stepped portion on the floor surface. Therefore, the load-lock chamber 130 and the vacuum transfer chamber 120 are configured so as not to hinder movement of a first transfer module 20 (to be described later) between the load-lock chamber 130 and the vacuum transfer chamber 120. The vacuum transfer chamber 120 is depressurized to the vacuum atmosphere by a vacuum exhaust mechanism (not illustrated). The vacuum transfer chamber 120 corresponds to the substrate transfer chamber of the present embodiment.

As illustrated in FIG. 1, the vacuum transfer chamber 120 in which the wafer W is transferred in the vacuum atmosphere is constituted with a rectangular housing formed to elongate in a front-rear direction in a plan view. In the wafer processing system 100 of the present example, on each of the right and left sidewall portions of the vacuum transfer chamber 120, three wafer processing chambers 110 (that is, six wafer processing chambers 110 in total) are provided via gate valves 111. The wafer W is transferred between the vacuum transfer chamber 120 and the wafer processing chambers 110 via respective openings (not illustrated) that are opened and closed by the gate valves 111.

The wafer processing chambers 110 are connected to the vacuum transfer chamber 120 via the above-mentioned openings, respectively, that are provided with the gate valves 111. A stage 112 is provided inside each wafer processing chamber 110. In each wafer processing chamber 110, a predetermined processing is performed on the wafer W placed on the stage 112 in a state in which an internal pressure of the wafer processing chamber 110 is reduced to the vacuum atmosphere by a vacuum exhaust mechanism (not illustrated). Examples of the processing to be performed on the wafer W may include etching, film formation, cleaning, ashing, and the like. The stage 112 is provided with, for example, a heater (not illustrated) configured to heat the wafer W to a predetermined temperature. When the processing to be performed on the wafer W uses a processing gas, the wafer processing chamber 110 is provided with a processing gas supplier (not illustrated) constituted with a shower head or the like. The wafer processing chamber 110 corresponds to the substrate processing chamber of the present embodiment.

Figure 2:
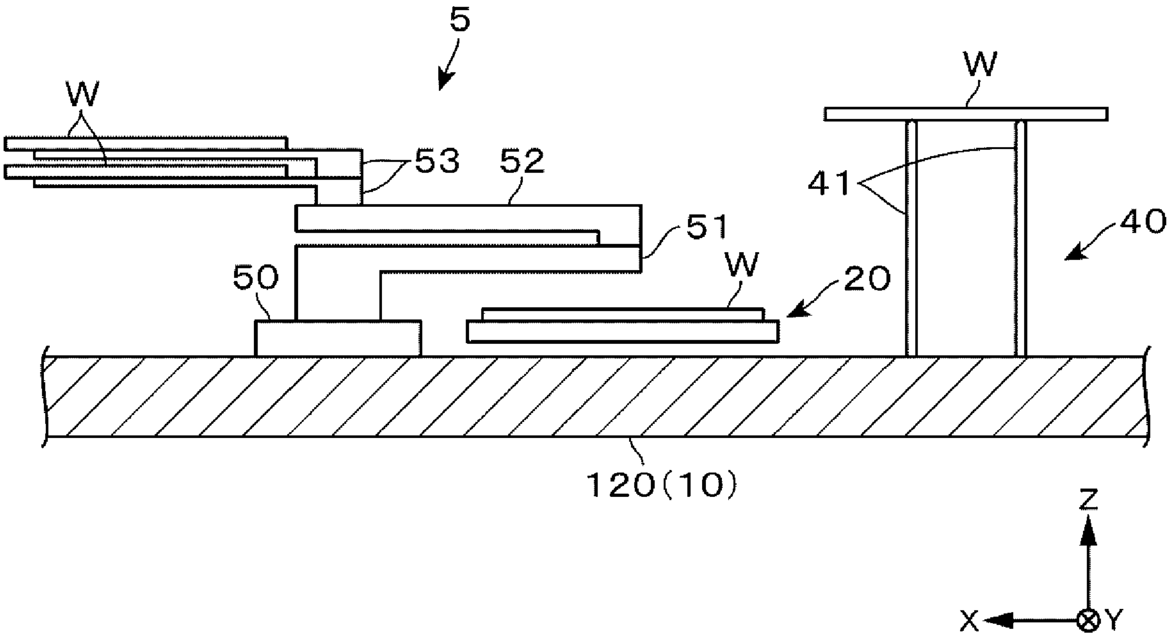
FIG. 2 is a vertical cross-sectional view of a portion of an interior of a vacuum transfer chamber provided in the wafer processing system.

When the interior of the vacuum transfer chamber 120 illustrated in FIG. 1 is viewed from the front side, in a case in which the interior of the vacuum transfer chamber 120 is divided into three regions such as a front-stage region, a middle-stage region, and a rear-stage region, the wafer processing chambers 110 are installed to face each other with respective regions interposed therebetween from left and right sides. A wafer transfer arm 5, which is a substrate transfer mechanism, is provided in each of the front region and the middle region. As illustrated in FIGS. 1 and 2, the wafer transfer arm 5 is configured with a base 50 fixed to the bottom surface of the vacuum transfer chamber 120, and an articulated arm, in which a lower arm portion 51 connected to the upper side of the base 50 via a rotary shaft (not illustrated), an upper arm portion 52, and a wafer holder 53 arranged in two stages are connected in this order from the lower side. With this configuration, the wafer transfer arm 5 may operate to be extensible and to be rotatable about a vertical axis. In the following description, the wafer transfer arm 5 provided in the front-stage region (front side) and the wafer transfer arm 5 provided in the middle-stage region (rear side) will be denoted together with letters A and B (5A and 5B).

In each of a space between the front-stage region and the middle-stage region and a space between the middle-stage region and the rear-stage region, three placement parts 4, which are substrate delivery parts on which wafers W are temporarily placed, are arranged side by side, for example, in the left-right direction. The positions at which the placement parts 4 are arranged correspond to positions at which the substrates are to be delivered. In a plan view, each placement part 4 is provided with three lifting pins 41 for supporting the wafer W to form a triangular support surface. The lifting pins 41 are configured to move up and down from the bottom surface of the vacuum transfer chamber 120 by a lifting mechanism (not illustrated) and push up and hold the wafer W from the lower side. In the drawings, regions where the wafers W supported by the lifting pins 41 are projected onto the bottom surface of the vacuum transfer chamber 120 are indicated as the placement parts 4 by dashed lines. In addition, the placement parts 4 arranged between the wafer transfer arm 5A and the wafer transfer arm 5B, and the placement parts 4 provided on the rear side of the wafer transfer arm 5B will be denoted together with letters A and B (4A and 4B).

The placement parts 4A and 4B are configured such that the lifting pins 41 protrude from the bottom surface of the vacuum transfer chamber 120 when holding the wafer W and the lifting pins 41 are lowered below the bottom surface of the vacuum transfer chamber 120 when not holding the wafer W. Accordingly, when no wafers W are held, first and second transfer modules 20 and 30 (to be described later) may pass above the placement parts 4A and 4B.

A distance between each of the placement parts 4A and 4B and the base 50 of each of the wafer transfer arms 5A and 5B in the front-rear direction is set to a distance that allows the first transfer module 20 (to be described later) to pass therethrough even when the lifting pins 41 are in a raised state (FIG. 2). In addition, a distance between the base 50 of the wafer transfer arm 5A located on the front side and the load-lock chambers 130 in the front-rear direction is also set to a distance that allows the first transfer module 20 to pass therethrough under the same conditions. Further, a distance between the placement parts 4B located on the rear side and the rear-side sidewall surface of the vacuum transfer chamber 120 in the front-rear direction is set to a distance that allows the second transfer module 30 (to be described later) to take a posture in which the arm portion 32 is oriented in the front-rear direction.

With the above-described configuration, in the vacuum transfer chamber 120, each wafer transfer arm 5 (5A or 5B) is arranged to be interposed between two openings to which the wafer processing chambers 110 are connected. A layout is provided in which the plurality of placement parts 4 are arranged along the alignment of these openings and the wafer transfer arm 5.

In addition to the wafer transfer arms 5A and 5B, the first transfer module 20 and the second transfer module 30, which are substrate transfer modules for transferring wafers W, are accommodated in the vacuum transfer chamber 120. In the present example, the first transfer module 20 configured in a disk shape, and the second transfer module 30 provided with the arm portion 32 having a fork-shaped substrate holder are accommodated.

Each of the first and second transfer modules 20 is configured to be movable within the vacuum transfer chamber 120 by magnetic levitation. In the following, a configuration of equipment relating to the transfer and processing of the wafer W by the first transfer module 20 will be described in detail.

Figure 3:
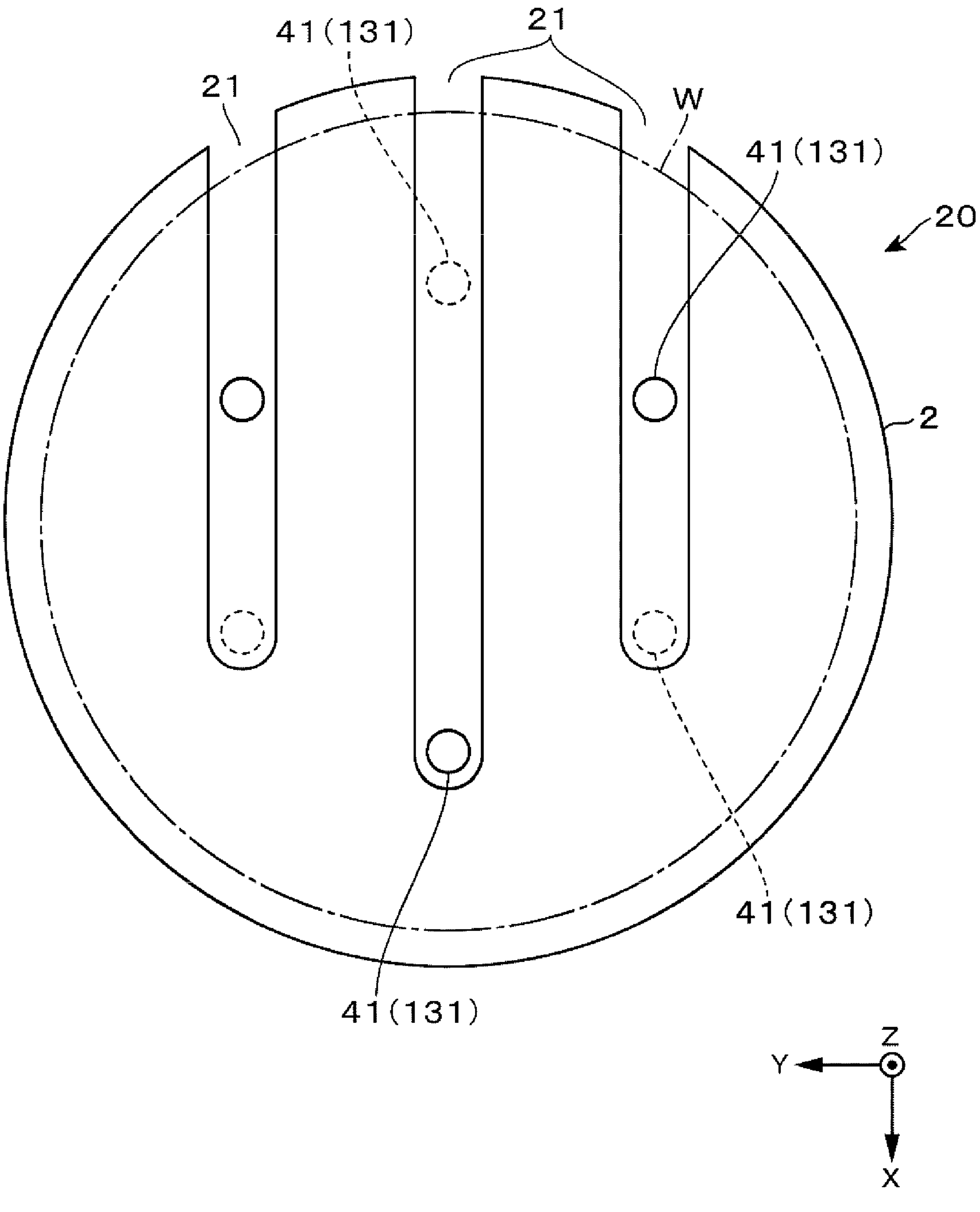
FIG. 3 is a plan view of a first transfer module.
Figure 4:
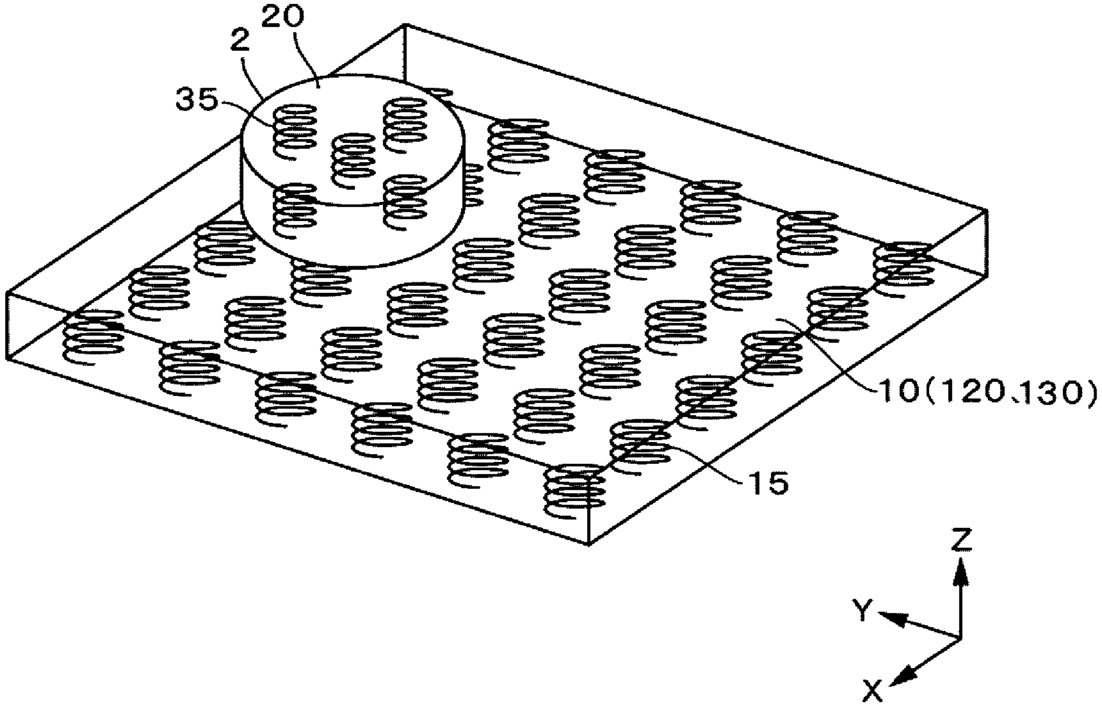
FIG. 4 is a schematic view illustrating a floor portion of the vacuum transfer chamber and the first transfer module.

As illustrated in FIGS. 3 and 4, the first transfer module 20 includes a stage 2 which is a substrate holder on which the wafer W is placed and held. For example, the stage 2 has a flat disk-like shape, and an upper surface thereof serves as a placement surface on which the wafer W to be transferred and processed is to be placed.

In addition, as illustrated in FIG. 3, the first transfer module 20 is provided with three slits 21 extending from a periphery of the stage 2 inward of the stage 2 such that the first transfer module 20 does not interfere with the lifting pins 41 and 131 in the placement part 4A or 4B and the load-lock chamber 13. In the following description, regarding the orientation of the first transfer module 20, directing an open end side of the slit 21 in a predetermined direction may be expressed as causing the first transfer module 20 to directly face something.

A relationship between the lifting pins 41 and 131 and the slits 21 will be described with reference to the placement part 4 in the vacuum transfer chamber 120 as an example. Here, it is assumed that the lifting pins 41 are in the state of protruding from the floor surface. First, the first transfer module 20 is disposed on the front side of the placement part 4 and moved toward the rear side of the vacuum transfer chamber 120 in a posture of directly facing the rear side of the vacuum transfer chamber 120. At this time, as described above, a distance that allows the first transfer module 20 to pass therethrough is secured between the placement part 4 and the base 50 of each wafer transfer arm 5. Therefore, the first transfer module 20 may be disposed be at a position directly facing the placement part 4 without interference between the first transfer module 20 and the lifting pins 41. In addition, the first transfer module 20 is disposed on the rear side of the placement part 4 and moved toward the front side in a posture of directly facing the front side of the vacuum transfer chamber 120. By this operation, the region in which the slits 21 are formed is moved along the arrangement positions of the lifting pins 41. As a result, the first transfer module 20 and the placement part 4 may be arranged vertically such that the centers of the first transfer module 20 and the lifting pins 41 are aligned without interfering with each other.

As schematically illustrated in FIG. 4, a plurality of floor-side coils 15 are arranged in each of the floor portions 10 of the vacuum transfer chamber 120 and the load-lock chamber 130. The floor-side coils 15 generate a magnetic field by being supplied with power from a power supply (not illustrated). From this point of view, the floor-side coils 15 correspond to a first magnet of the present embodiment.

On the other hand, a plurality of module-side coils 35 are arranged inside the first transfer module 20 as well. A repulsive force acts between the module-side coils 35 and the magnetic fields generated by the floor-side coils 15. By this action, the first transfer module 20 may be magnetically levitated with respect to the floor portion 10. In addition, by adjusting the strength and positions of the magnetic fields generated by the floor-side coils 15, the first transfer module 20 may be moved in a desired direction on the floor portion 10, or a floating level and the orientation of the first transfer module 20 may be adjusted.

The module-side coils 35 provided in the first transfer module 20 correspond to a second magnet of the present embodiment. The module-side coils 35 are supplied with power from a battery (not illustrated), which is a magnet power supply provided in the first transfer module 20, and function as electromagnets. In addition, a configuration may be adopted in which a permanent magnet is additionally provided inside the first transfer module 20 in addition to the plurality of module-side coils 35. Additionally, the module-side coils 35 may be constituted only with permanent magnets.

For example, each module-side coil 35 is controlled by a feeding controller (not illustrated) provided in the first transfer module 20 such that power supplied to the module-side coil 35 is increased/decreased or the supply/cutoff of the power is performed. At this time, the feeding controller may be configured to obtain a control signal related to feeding control through wireless communication with a controller 9, which will be described later.

In addition, as described above, the first transfer module 20 has a size that can pass through the spaces between the base 50 of each of the wafer transfer arms 5A and 5B and the placement part 4 (FIGS. 1 and 2). Further, as illustrated in FIG. 2, the second transfer module 30 has a height dimension that can pass below the lower arm portion 51 turning at each of the wafer transfer arms 5A and 5B in the state of holding the wafer W.

Figure 5:
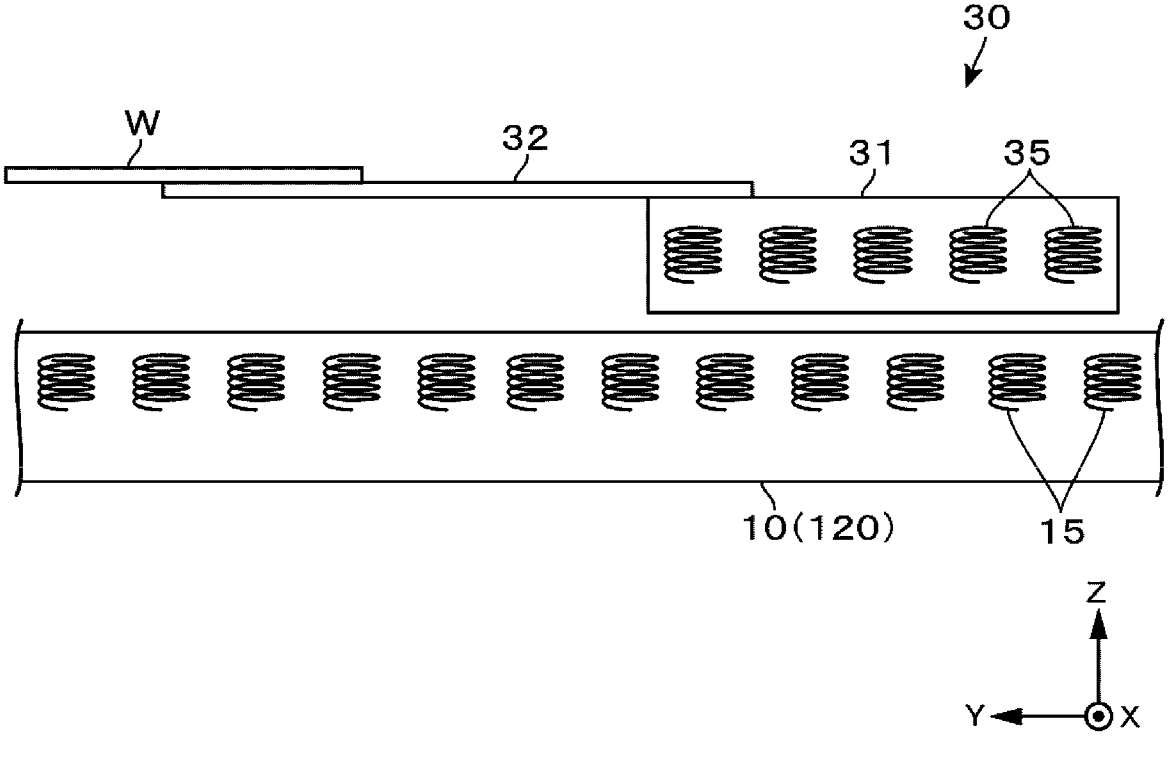
FIG. 5 is a vertical cross-sectional view of a second transfer module.
Figure 6:
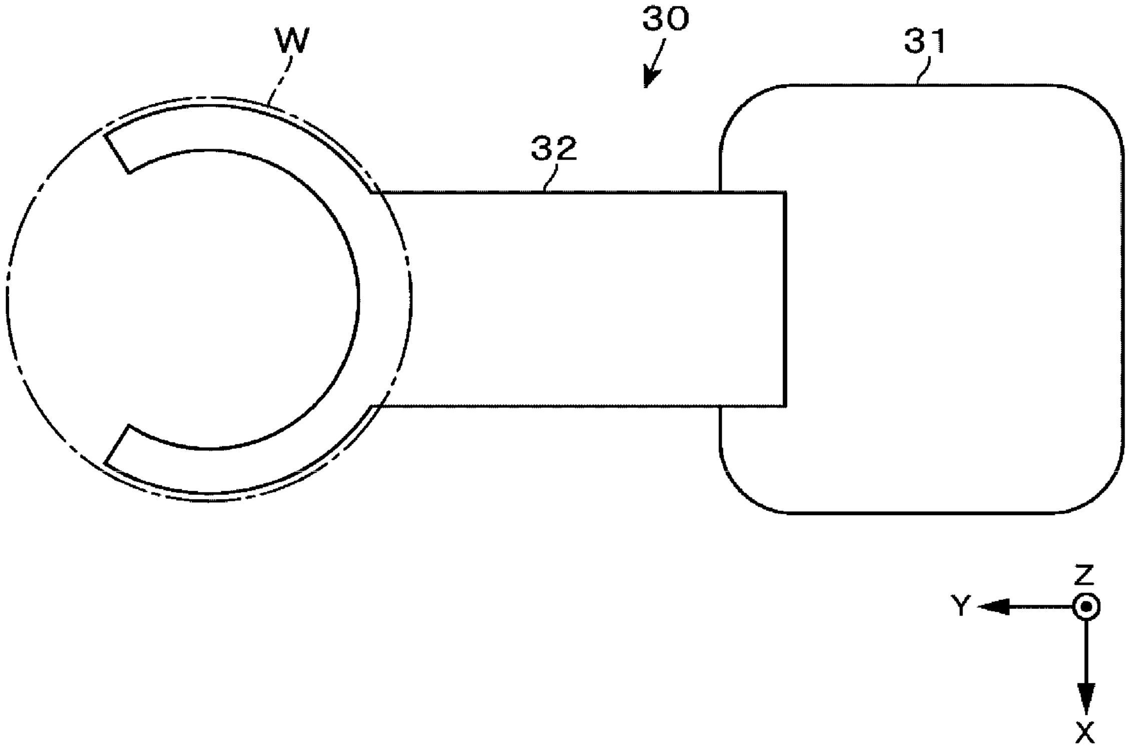
FIG. 6 is a plan view of the second transfer module.

Next, a configuration of the second transfer module 30 disposed in the rear stage of the vacuum transfer chamber 120 will be described. As illustrated in FIGS. 5 and 6, the second transfer module 30 has substantially the same width dimension as the first transfer module 20 and includes a main body portion 31 having a rectangular planar shape. The main body portion 31 is provided with an arm portion 32 which extends horizontally and holds the wafer W horizontally. In a tip end of the arm portion 32, a fork that may be disposed to surround a region provided with three lifting pins 41 or 131 from the left and right is provided. The fork corresponds to the substrate holder in the second transfer module 30. The arm portion 32 is set to have a length that can deliver the wafer W to the stage 112 by opening the gate valve 111 and inserting the arm portion 32 into the wafer processing chamber 110 while the main body portion 31 is located inside the vacuum transfer chamber 120.

In addition, module-side coils 35 similar to those of the first transfer module 20 are provided inside the main body portion 31 of the second transfer module 30. With this configuration, like the first transfer module 20, the second transfer module 30 can be moved in a desired direction on the floor portion 10 or can be adjusted in the floating amount and the orientation of the second transfer module 30.

The vacuum transfer chamber 120, which includes the first and second transfer modules 20 and 30 and the wafer transfer arms 5 described above, constitutes a substrate transfer apparatus of the present disclosure.

Returning to FIG. 1, the wafer processing system 100 having the above-described configuration includes a controller 9 that controls the floor-side coils 15, the wafer processing chamber 110, and the like. The controller 9 is constituted with a computer including a CPU and a storage, and controls each part of the wafer processing system 100. Programs in which a group of steps (instructions) for controlling the operations or the like of the first and second transfer modules 20 and 30 or the wafer processing chambers 110 are recorded in the storage. The programs are stored in a storage medium such as a hard disk, a compact disk, a magnetic optical disk, or a memory card, from which the programs are installed on the computer.

Next, an example of the operations of the wafer processing system 100 will be described. First, when the carrier C accommodating the wafers W to be processed is placed on the load port 141, the wafer W is taken out from the carrier C by the wafer transfer mechanism 142 in the atmospheric transfer chamber 140. The wafer W is then transferred to the alignment chamber 150 and aligned. In addition, when the wafer W is taken out from the alignment chamber 150 by the wafer transfer mechanism 142, the gate valve 133 is opened.

Subsequently, the wafer transfer mechanism 142 enters into the load-lock chamber 130, and the lifting pins 131 push up to receive the wafer W. Here, for example, the first wafer W is loaded into the leftmost load-lock chamber 130 when viewed from the front side to the rear side. Thereafter, when the wafer transfer mechanism 142 retreats from the load-lock chamber 130, the gate valve 133 is closed. In addition, the interior of the load-lock chamber 130 is switched from the atmospheric pressure atmosphere to the vacuum atmosphere. Subsequently, the wafers W are similarly transferred to respective load-lock chambers 130. In this example, for example, the second wafer W is transferred to the rightmost load-lock chamber 130.

When the interior of the load-lock chamber 130 becomes the vacuum atmosphere, the gate valve 132 is opened. At this time, in the vacuum transfer chamber 120, the first transfer module 20A stands by in the vicinity of the connection position of the load-lock chamber 130 in a posture of directly facing the load-lock chamber 130. The magnetic fields generated by the floor-side coils 15 provided in the floor portion 10 are used to raise the first transfer module 20A by magnetic levitation based on a repulsive force.

Subsequently, the transfer of the wafers W from the load-lock chambers 130 to respective wafer processing chambers 110 will be described. First, an example in which the wafers W are sequentially transferred to the wafer processing chamber 110 in the front stage and the wafer processing chamber 110 in the middle stage will be described with reference to FIGS. 7 to 10. Here, an example in which the wafers W are sequentially transferred to respective wafer processing chambers 110 provided on the right side of the vacuum transfer chamber 120 when viewed from the front side will be described. In FIGS. 7 to 10, letter A is added to the reference numeral of the first transfer module 20 that transfers the wafer W first (20A), and letter B is added to the reference numeral of the first transfer module 20 that subsequently transfers the wafer W(20B).

Figure 7:
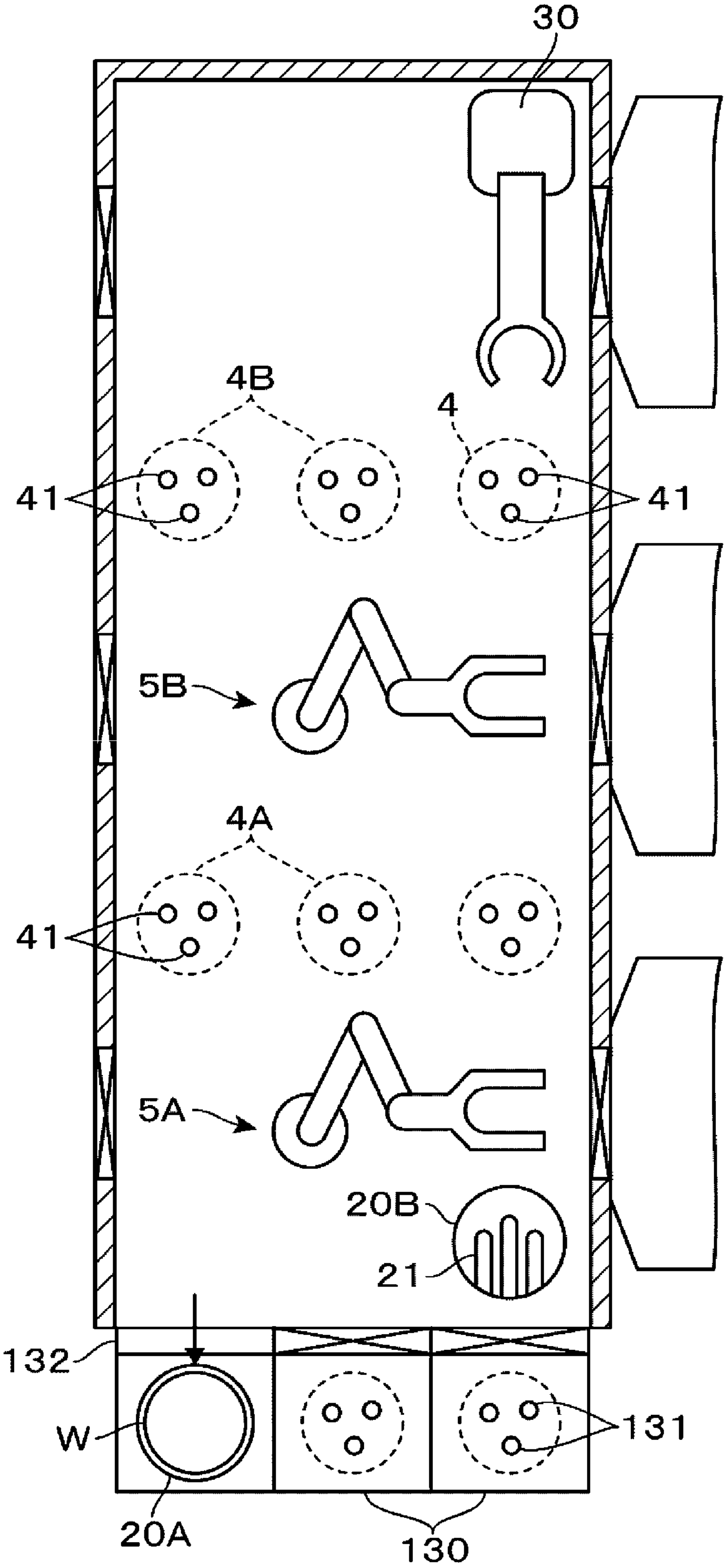
FIG. 7 is a first operational view relating to an example of an operation of the transfer module.

First, as illustrated in FIG. 7, the first transfer module 20A enters into the load-lock chamber 130 and is located below the wafer W supported by the lifting pins 131. In addition, when the lifting pins 131 are lowered and the wafer W is transferred to the first transfer module 20, the wafer W is placed on the stage 2.

Next, the first transfer module 20A holding the wafer W is retreated from the load-lock chamber 130 and is moved linearly to the placement part A4 on the front side.

Figure 8:
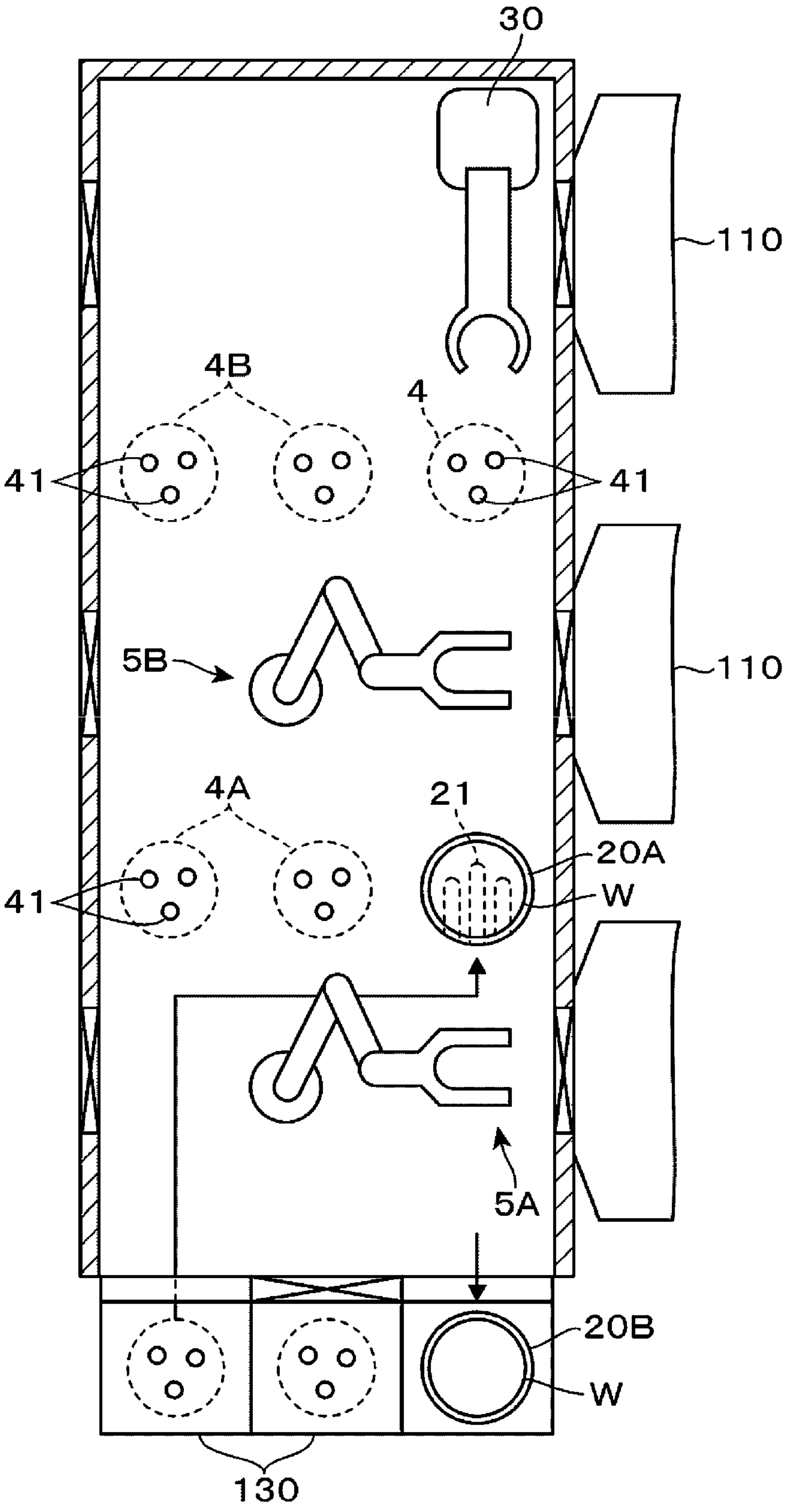
FIG. 8 is a second operational view relating to an example of the operation of the transfer module.

Subsequently, the first transfer module 20A moves rightward between the placement part 4A on the front side and the base 50 of the wafer transfer arm 5A on the front side. At this time, the first transfer module 20A moves rightward in parallel without changing its direction. Then, after moving to the front of the rightmost placement part 4A, the first transfer module 20A changes its movement direction to the rear side and reaches the upper side of the placement part 4 (FIG. 8).

Further, in the placement part 4A, the lifting pins 41 are raised to push up and receive the wafer W held by the first transfer module 20A. At this time, the subsequent wafer W is loaded into the leftmost load-lock chamber 130, and the atmosphere in the load-lock chamber 130 is similarly switched to the vacuum atmosphere. Then, the first transfer module 20B enters into the load-lock chamber 130 and receives the wafer W therefrom.

Figure 9:
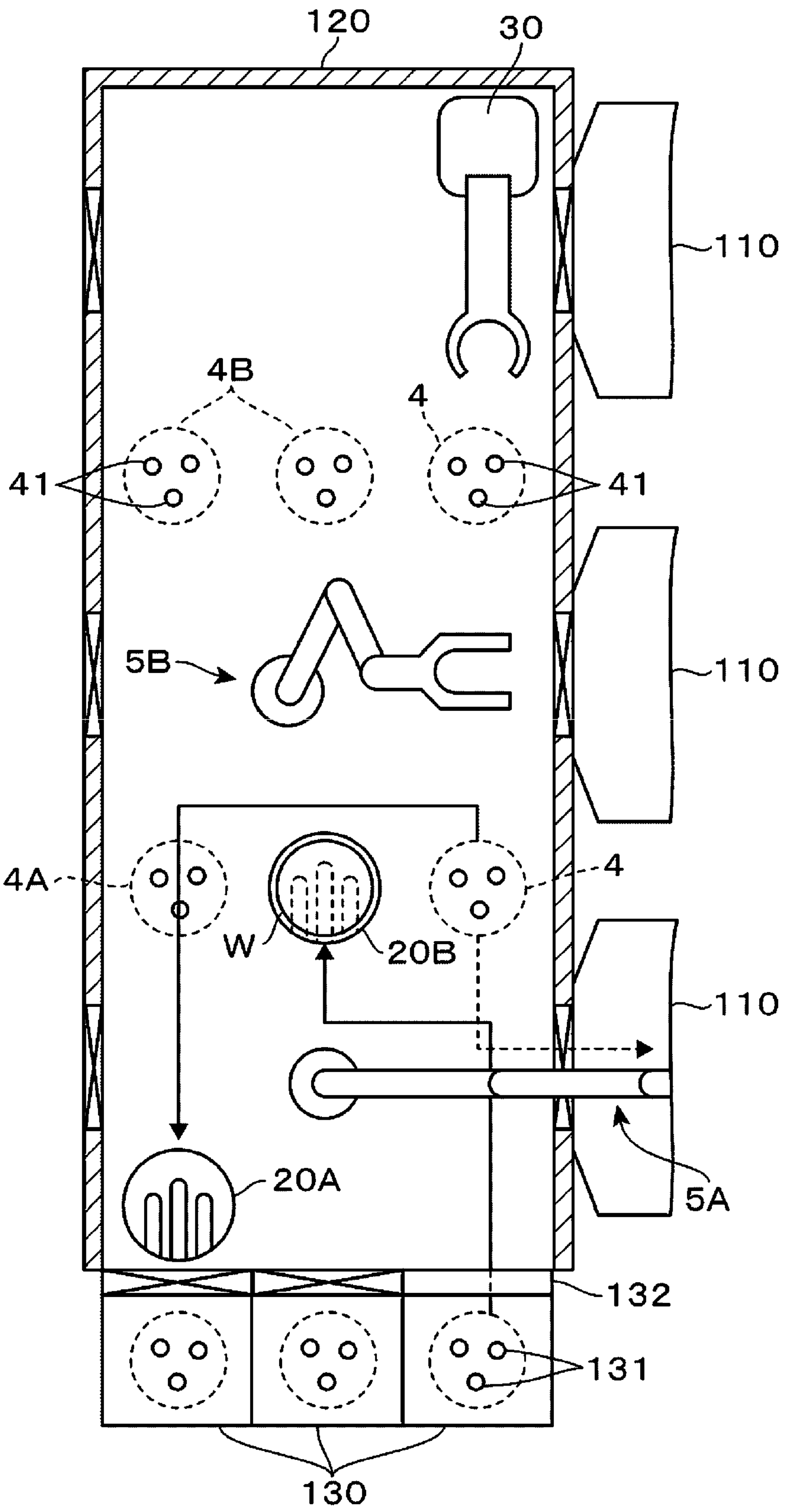
FIG. 9 is a third operational view relating to an example of the operation of the transfer module.

Subsequently, as illustrated in FIG. 9, the first transfer module 20A, which has delivered the wafer W, moves to the rear side of the corresponding placement part 4A, and moves from the right side to the left side on the rear side of the placement parts 4A on the front side. In addition, the first transfer module 20A moves linearly toward the front side and stands by on the rear side of the load-lock chamber 130 on the left side.

The first transfer module 20A moves to the placement part 4A in a state in which the lifting pins 41 are not raised while maintaining the posture of directly facing the load-lock chamber 130. This allows the first transfer module 20A to move along a trajectory illustrated in FIG. 9 without interfering with the lifting pins 41. This point is the same for the operation of the other first transfer module 20B.

In addition, the wafer transfer arm 5A on the front side receives the wafer W delivered to the placement part 4A on the right side and transfer the wafer W to, for example, the wafer processing chamber 110 on the right side in the front stage.

At this time, the first transfer module 20B holding the subsequent wafer W is retreated from the load-lock chamber 130 and moves linearly to the front side of the placement part 4A. In addition, the transfer module 20B changes its movement direction and moves leftward between the placement part 4A and the wafer transfer arm 5A on the front side. Then, after moving to the front side of the placement part 4A on the central side, the movement direction is changed to the rear side and reaches the upper side of the placement part 4A (FIG. 9). Then, the lifting pins 41 of the placement part 4A are lifted up, and the wafer W is delivered to the lifting pins 41.

Figure 10:
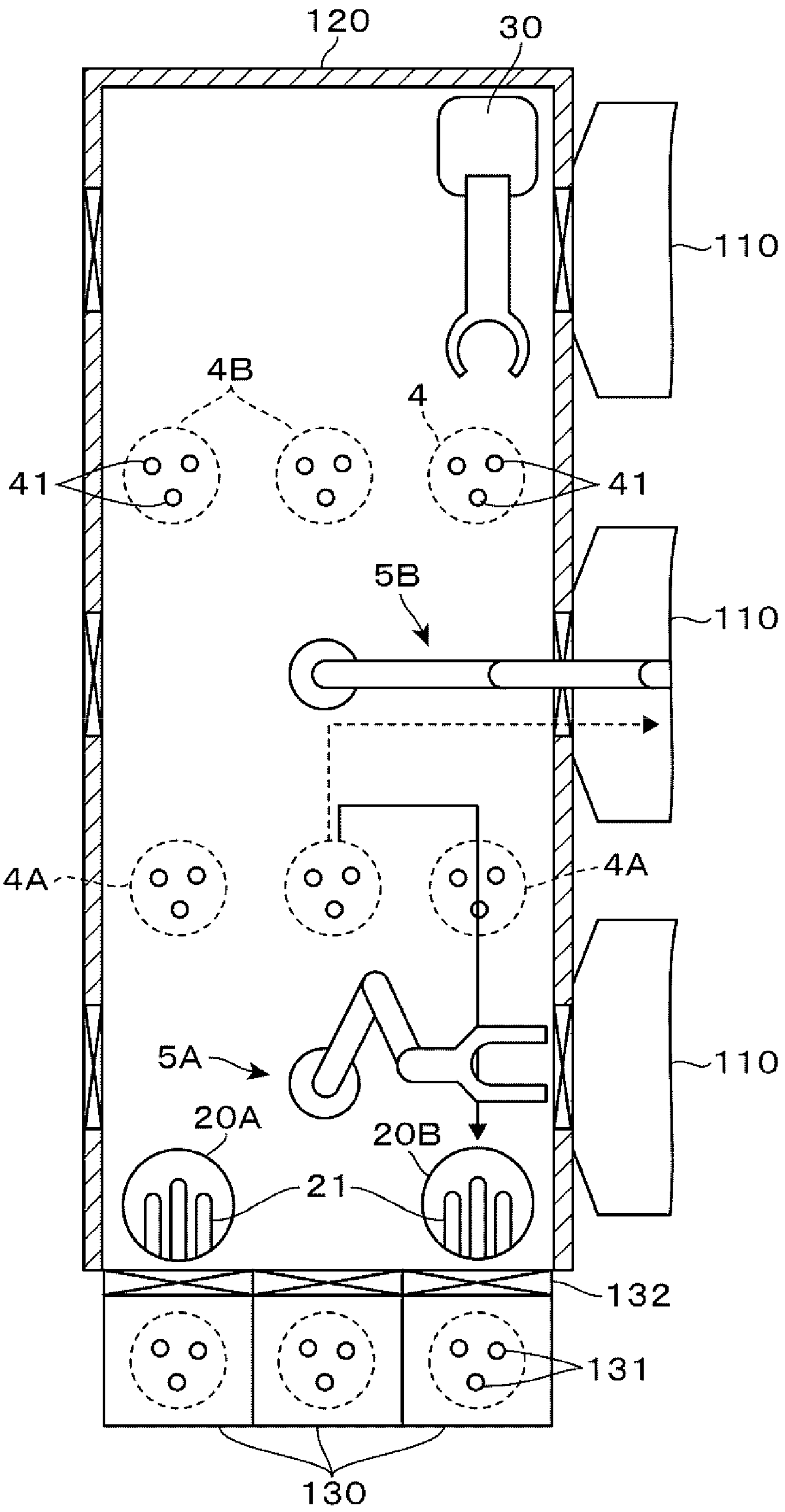
FIG. 10 is a fourth operational view relating to an example of the operation of the transfer module.

Subsequently, as illustrated in FIG. 10, the first transfer module 20B, which has delivered the wafer W, moves to the rear side of the corresponding placement part 4, and then changes its movement direction to the right. Thereafter, the first transfer module 20B moves linearly toward the front side and stands by on the rear side of the rightmost load-lock chamber 130.

On the other hand, the wafer transfer arm 5B on the rear side receives the wafer W delivered to the placement part 4A on the central side and transfers the corresponding wafer W to, for example, the wafer processing chamber 110 on the right side of the middle stage.

Figure 11:
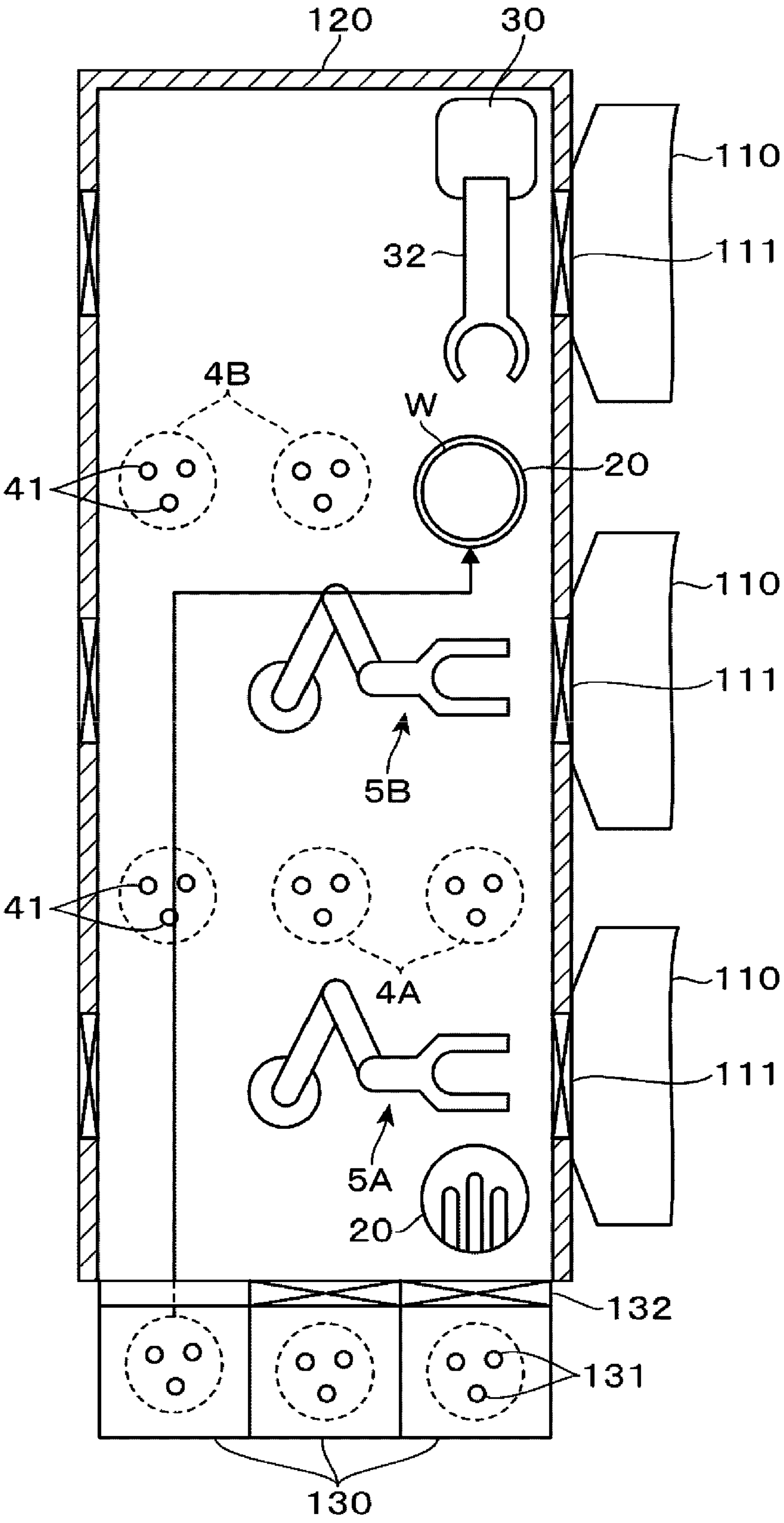
FIG. 11 is a first operational view relating to another example of the operation of the transfer module.

Next, the operation of transferring wafers W from the load-lock chambers 130 to the subsequent wafer processing chamber 110 will be described with reference to FIGS. 11 to 13. In this example, the case where the wafers are transferred to the wafer processing chamber 110 installed on the right side of the rear stage of the vacuum transfer chamber 120 will be described.

First, the wafer W is delivered to the first transfer module 20 from, for example, the load-lock chamber 130 on the left side. Next, as illustrated in FIG. 11, the first transfer module 20, which has received the wafer W, moves linearly toward the rear side to the front side of the placement part 4B on the rear side.

In addition, the first transfer module 20 changes its movement direction and moves rightward between the placement parts 4B on the rear side and the wafer transfer arm 5B on the rear side. Then, after moving to the front side of the placement part 4B on the right side, the first transfer module 20 changes its movement direction to the rear side and reaches the upper side of the placement part 4B on the right side. Then, for example, the first transfer module 20 rotates about a vertical axis in-situ and changes its orientation to directly face the placement part 4B. Here, since the first transfer module 20 has a posture of directly facing the front side when coming out of the load-lock chamber 130, the first transfer module 20 may be rotated 180 degrees about the vertical axis on the upper side of the placement part 4. At this time, the second transfer module 30 is on standby with a posture of causing the arm portion 32 to face the front side on the rear side of the right side placement part 4B.

Figure 12:
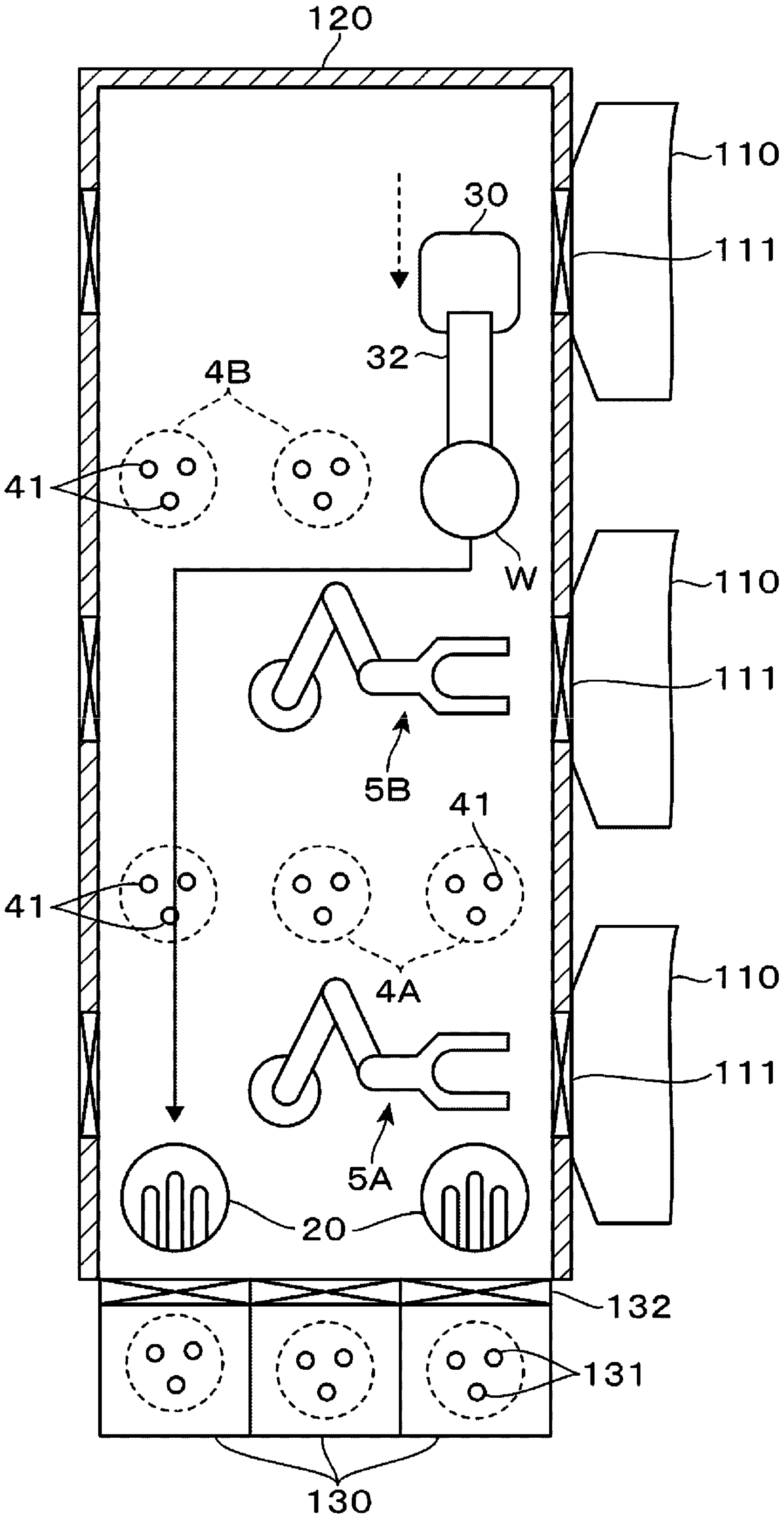
FIG. 12 is a second operational view relating to another example of the operation of the transfer module.

Subsequently, as illustrated in FIG. 12, when the lifting pins 41 of the placement part 4 are raised to push up and receive the wafer W, the first transfer module 20 moves to the front side. In addition, after rotating 180 degrees about the vertical axis, the first transfer module 20 moves leftward between the placement part 4B on the rear side and the wafer transfer arm 5B on the rear side. Further, the first transfer module 20 moves linearly to the front side, returns to the rear side of the leftmost load-lock chamber 130, and stands by.

On the other hand, the second transfer module 30 is moved forward to position the arm portion 32 on the placement part 4B, and the lifting pins 41 of the placement part 4B are lowered to deliver the wafer W to the arm portion 32.

Figure 13:
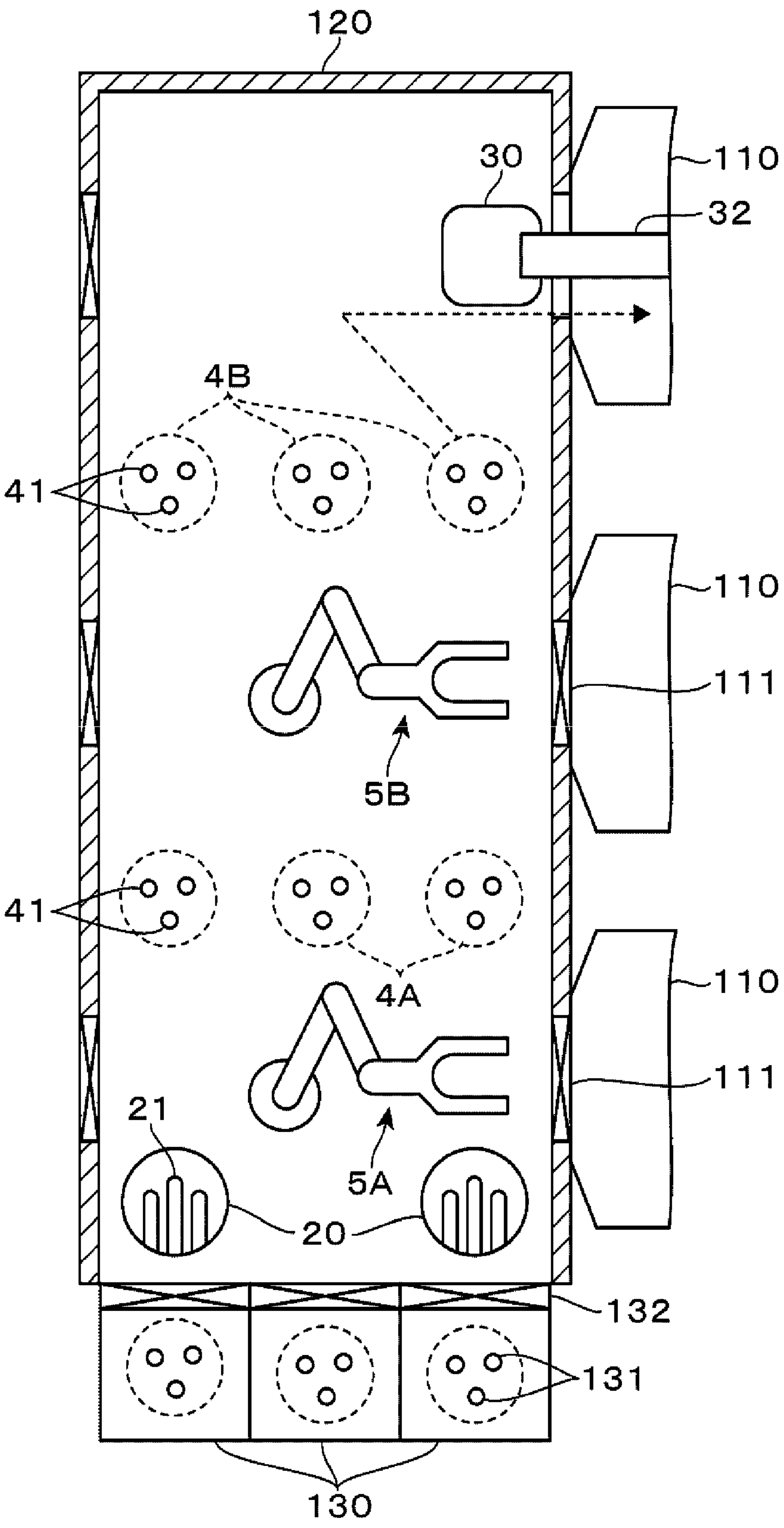
FIG. 13 is a third operational view relating to another example of the operation of the transfer module.

In addition, as illustrated in FIG. 13, the second transfer module 30 holding the wafer W performs a transition operation of retreating while changing its orientation when viewed from the placement part 4B so that the tip end of the arm portion 32 faces the wafer processing chamber 110 on the right side. Next, the gate valve 111 of the wafer processing chamber 110 is opened, and the second transfer module 30 is moved linearly so that the arm portion 32 enters into the wafer processing chamber 110 and delivers the wafer W to the same. When the wafer W is delivered, the main body portion 31 of the second transfer module 30 is positioned inside the vacuum transfer chamber 120, and only the arm portion 32 enters into the wafer processing chamber 110 (FIG. 13).

When the loading of the wafer W into each wafer processing chamber 110 is completed by each of the above-described operations, the wafer transfer arms 5A and 5B and the arm portion 32 are retreated to the vacuum transfer chamber 120, and the gate valves 111 are closed. Subsequently, the wafers W are sequentially heated by the stages 112 to raise the temperature to a preset temperature, and the processing gas is supplied from a processing gas supplier into the wafer processing chambers 110. In this way, desired processing is performed on the wafers W.

After the processing of the wafers W are performed for a preset period of time in this way, the heating of the wafers W is stopped, and the supply of the processing gas is stopped. In addition, the wafer W may be cooled by supplying a cooling gas into the wafer processing chamber 110 as needed. Thereafter, the wafers W are transferred in the reverse procedure of the loading procedure, and the wafers W are returned from the wafer processing chambers 110 to the load-lock chambers 130.

In addition, after switching the atmospheres of the load-lock chambers 130 to a normal pressure atmosphere, the wafers W in the load-lock chambers 130 are taken out by the wafer transfer mechanism 142 on the atmospheric transfer chamber 140 side and returned to a predetermined carrier C.

In the above-described embodiment, when transmitting the wafers W to the wafer processing chambers 110, the first transfer modules 20 transfer the wafers W from the load-lock chambers 130 to the placement parts 4 provided in the vacuum transfer chamber 120.

On the other hand, in the case of a configuration in which the first transfer modules 20 are not provided in the vacuum transfer chamber 120, it is also necessary to use the wafer transfer arms 5A and 5B to transfer the wafers W in the front-rear direction between the load-lock chambers 130 and the placement parts 4B in the front stage and between the placement parts 4A in the front stage and the placement parts 4B in the rear stage. Therefore, in addition to the operation of transferring the wafer W to the wafer processing chamber 110, each of the wafer transfer arms 5A and 5B further performs an operation of transferring the wafer W in the front-rear direction. As a result, the load of the operation of transferring wafers W by the wafer transfer arms 5A and 5B is increased. An increase in the load on a specific device may restrict the increase in the number of wafers W that can be processed per unit time by the wafer processing system 100. On the other hand, additional provision of a dedicated wafer transfer arm for transferring the wafer W in the front-rear direction is not realistic since it causes problems of a lack of arrangement space, interference with the other wafer transfer arms 5A and 5B, and a restriction on a position where the additional wafer transfer arm is capable of transferring wafers.

In contrast, by installing the first transfer modules 20 that are capable of relatively freely moving in the vacuum transfer chamber 120, the transfer of the wafers W from the load-lock chambers 130 to each placement part 4 may be shared by the first transfer modules 20. Therefore, the wafer transfer arms 5 only have to share the transfer of the wafers W between the placement parts 4 and the wafer processing chambers 110. Therefore, an increase in the load on the wafer transfer arms 5 can be suppressed.

In addition, as described above, a plurality of placement parts 4 are arranged along the alignment of the wafer processing chambers 110 and the wafer transfer arms 5. With this configuration, the wafer W transfer operation by the wafer transfer arms 5 and the first transfer modules 20 may be efficiently executed while securing the movement space of the first transfer modules 20.

Here, the floor-side coils 15 may also be installed on the floor portions of the wafer processing chambers 110 so that the first transfer modules 20 can directly enter into the wafer processing chambers 110 to transfer the wafers W. In addition, for example, each of the first and second transfer modules 20 and 30 having different allowable temperatures may be used depending on the temperatures of the wafers W before and after processing in the wafer processing chambers 110.

When wafers W are transferred by the first transfer modules 20, alignment of notches and orientation flats (OFs) of the wafers W may be performed. When processing the wafers W in the wafer processing chambers 110, it may be necessary to perform the processing in the state in which the notches or OFs are directed in a predetermined direction based on the results of pre-alignment performed in the alignment chamber 150. On the other hand, as illustrated in FIG. 1, in the case where the wafer processing chambers 110 are arranged on the left and right sides of the wafer transfer arms 5, when the wafers W placed on the placement parts 4 are always directed in the same direction, the orientations of the notches or OFs may differ from each other by 180 degrees between the wafer processing chambers 110 on the left and right sides.

In such a case, the first transfer modules 20 may also be used for alignment of notches or OFs. In addition, in FIGS. 14 and 15 described below, the illustration of the wafer transfer arms 5 is omitted for the sake of convenience in illustration.

Figure 14:
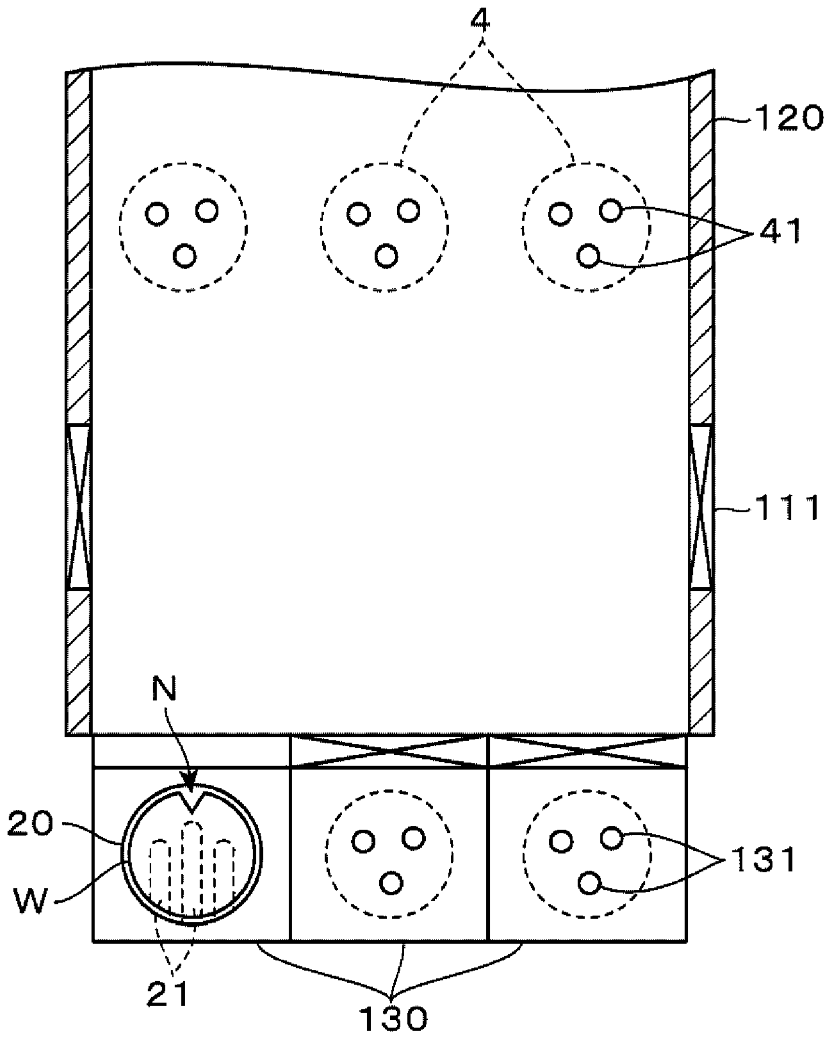
FIG. 14 is a first operational view relating to a notch alignment by the transfer module.

Then, as an example of notch alignment, it is assumed that the wafer W in which a notch has been aligned by alignment is disposed as illustrated in FIG. 14. Here, it is assumed that when the wafer W is placed on the placement part 4 without changing the orientation of the notch and is loaded into a wafer processing chamber 110 on the right side by the wafer transfer arm 5, the wafer W is rotated by 180 degrees about a vertical axis with respect to a preset orientation.

Figure 15:
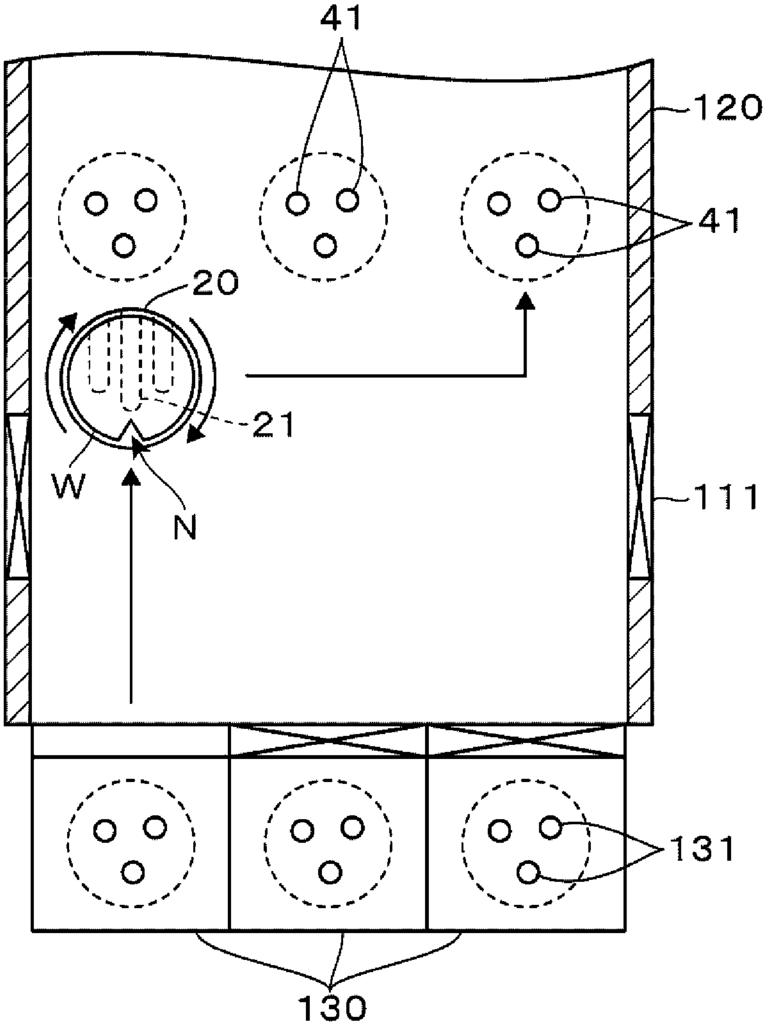
FIG. 15 is a second operational view relating to the notch alignment by the transfer module.
Figure 16:
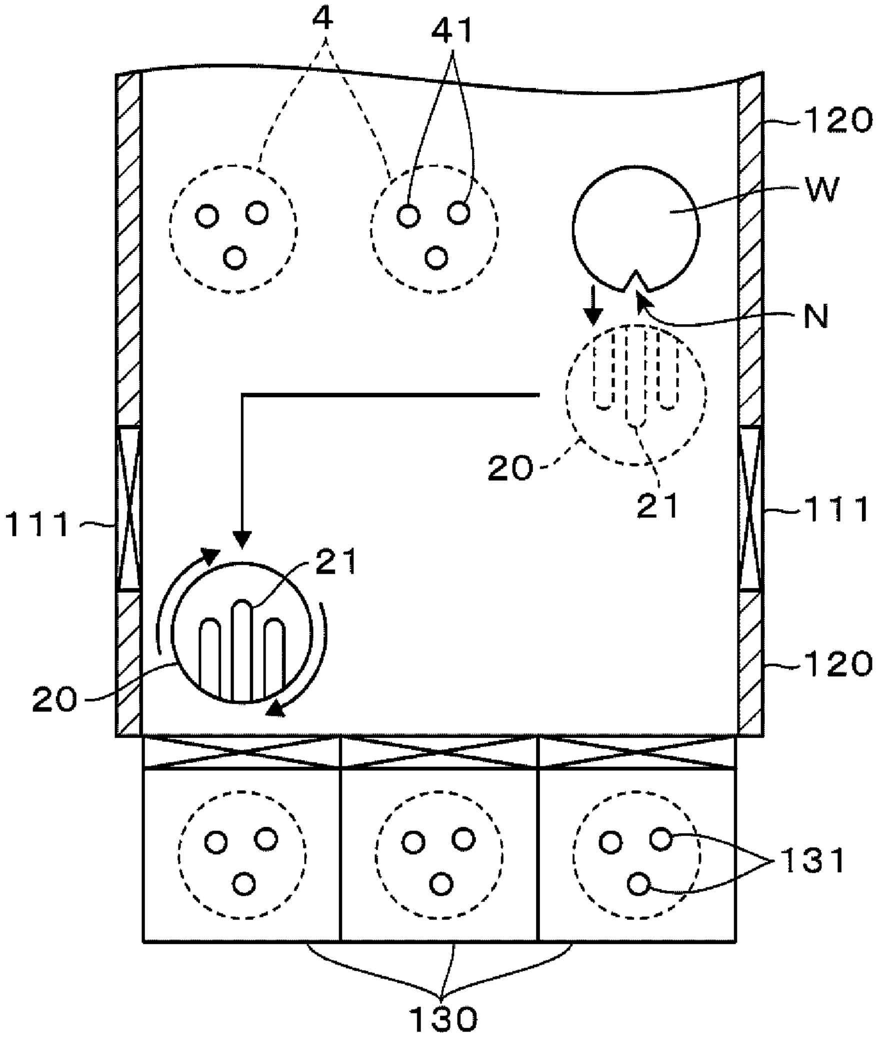
FIG. 16 is a third operational view relating to the notch alignment by the transfer module.

In this case, for example, when the first transfer module 20 holding the wafer W enters into the vacuum transfer chamber 120 from the load-lock chamber 130, the first transfer module 20 is rotated by 180 degrees about the vertical axis as illustrated in FIG. 15. Then, by delivering the wafer W to the placement part 4 as illustrated in FIG. 16, the direction of the wafer W to be delivered to the placement part 4 can be rotated by 180 degrees. In addition, the first transfer module 20 retreats from the position of the placement part 4, rotates by 180 degrees about the vertical axis, returns to the rear side of the leftmost load-lock chamber 130, and stands by (FIG. 16). By using the first transfer module 20 based on the magnetic levitation in this way, there is no need to provide a separate notch alignment device in the wafer processing system 100.

Figure 17:
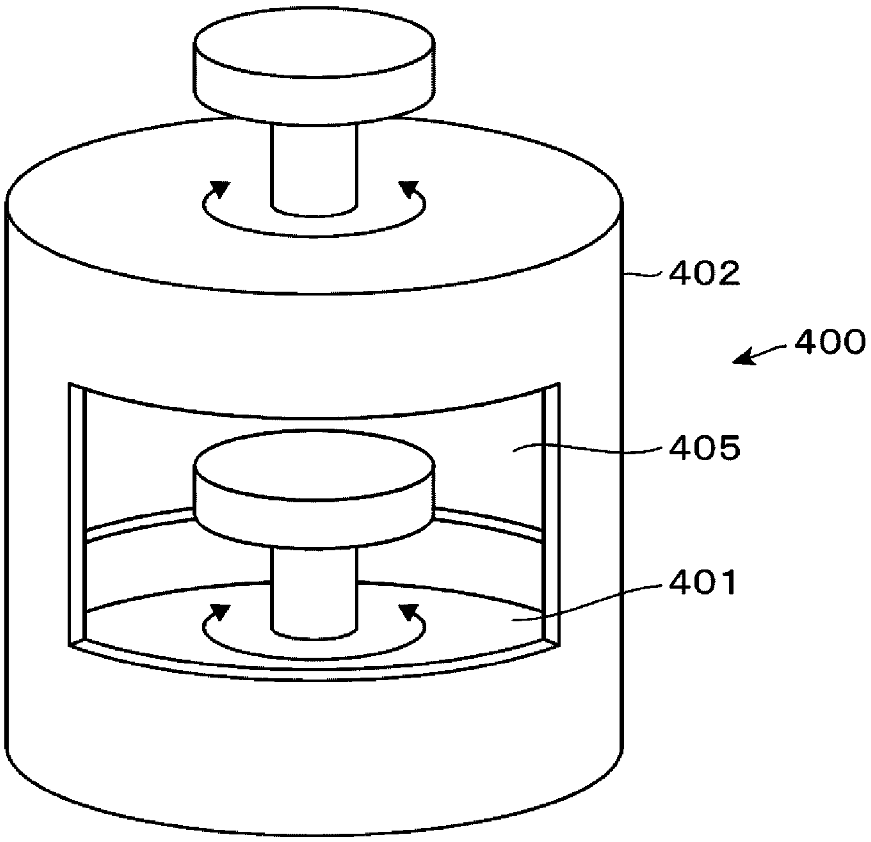
FIG. 17 is a perspective view illustrating a placement module installed on a placement part.
Figure 18:
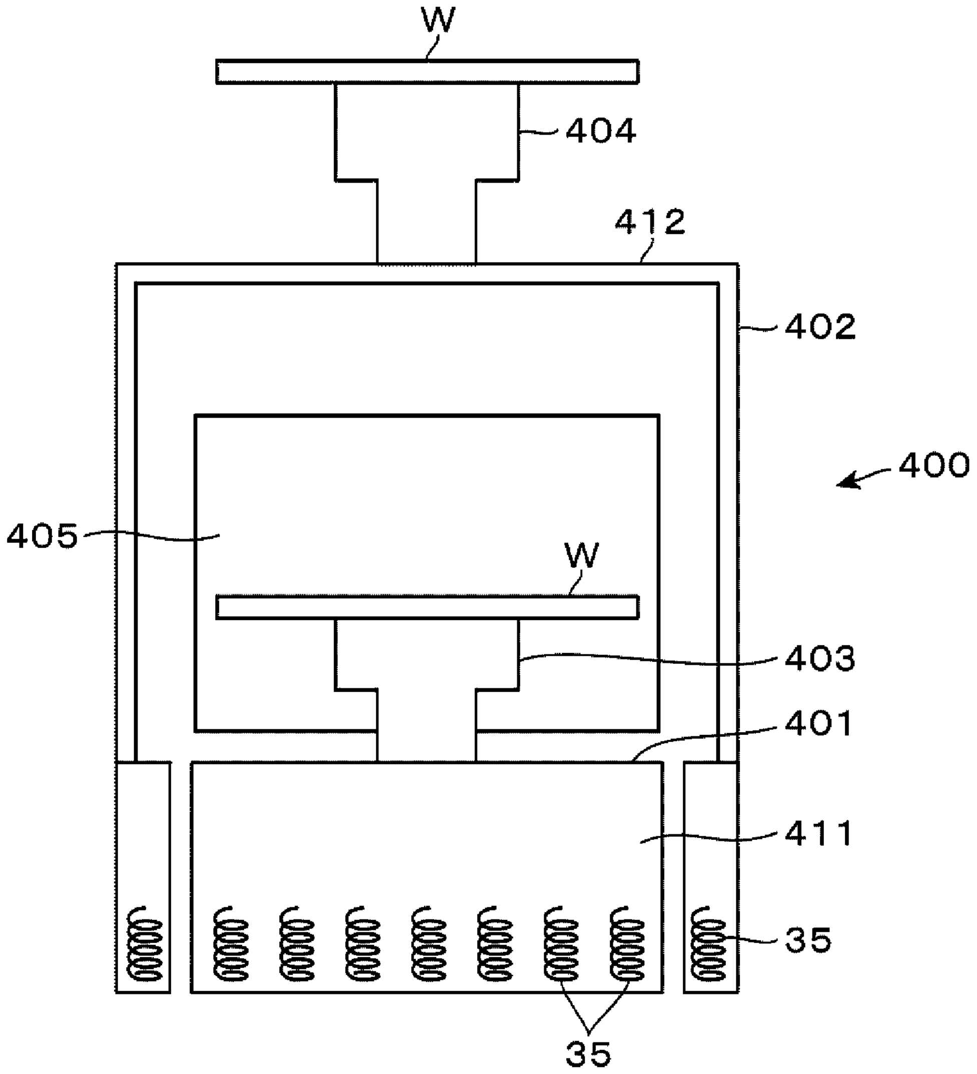
FIG. 18 is a vertical cross-sectional view illustrating the placement module installed on the placement part.

Next, FIGS. 17 and 18 illustrate examples of a placement module 400 that constitutes a substrate delivery part disposed on the placement part 4. This placement module 400 is configured to be rotatable about a vertical axis by using magnetic levitation. This placement module 400 includes two stages 401 and 402 so that the wafers W can be placed vertically in two stages. For example, the lower stage 401 includes a base 411, and a holder 403 configured to hold the center of the bottom surface of the wafer W is provided above the base 411. The holder 403 is configured to deliver the wafer W to and from the wafer holder 53 of each first transfer module 20.

The upper stage 402 includes a cylindrical portion 412 surrounding the lower stage 401. A holder 404 configured to hold the center of the bottom surface of the wafer W is provided above the cylindrical portion 412. Two windows 405 are formed at positions facing each other on the side surface of the cylindrical portion 412 to deliver the wafer W to the lower stage 401. The holder 404 is also configured to deliver the wafer W to and from the wafer holder 53 of each first transfer module 20.

In addition, module-side coils 35, which are substrate delivery part-side magnets, are provided at each of lower ends of the base 411 of the stage 401 and the cylindrical portion 412 of the stage 402. Each of the stages 401 and 402 is configured to be independently rotatable about a vertical axis by using the repulsive force between the module-side coils 35 and the floor-side coils 15 provided in the floor portion 10 of the vacuum transfer chamber 12. With the placement module 400 of the present example, the orientation of the wafer W can be changed when the wafer is held by the first transfer module 20 and when the wafer is held by the wafer transfer arm 5. In the present example, instead of the notch or OF alignment operations for wafers W by the first transfer modules 20 described with reference to FIGS. 14 to 16, the operations of transferring and rotating the wafers W may be shared by providing dedicated placement modules 400.

Figure 19:
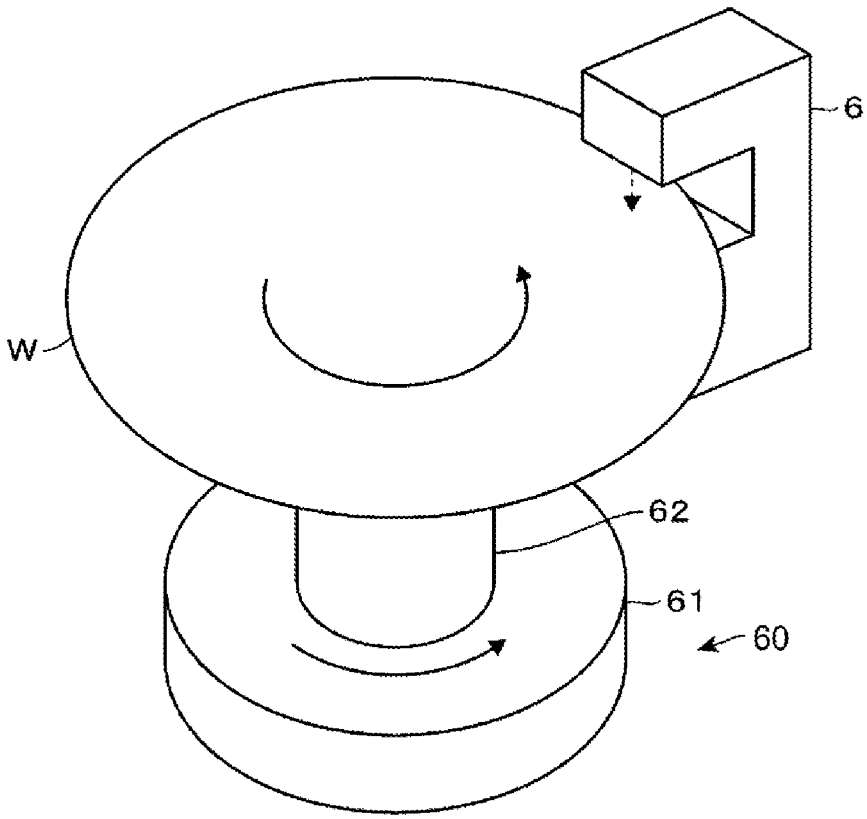
FIG. 19 is an explanatory view illustrating alignment.

Next, FIG. 19 illustrates an example of aligning the wafer W by using a transfer module using magnetic levitation. A transfer module 60 illustrated in FIG. 19 includes a main body portion 61 provided with module-side coils 35 and a column portion 62 that extends upward from an upper surface of the main body portion 61 and has a diameter smaller than that of the wafer W. On the upper surface of the column portion 62, a substrate holding surface serving as a substrate holder is formed. The wafer W is supported from the bottom surface side by the substrate holding surface.

In the alignment using the above-mentioned transfer module 60, for example, a wafer sensor 6 for alignment is used. The wafer sensor is a detector provided with a light receiver configured to emit light downward and receive the light on the lower side. The wafer sensor 6 detects a position of a periphery of the wafer W located outside the column portion 62. The wafer sensor 6 is provided in, for example, the load-lock chamber 130.

Then, for example, in a state in which the transfer module 60 is on standby in the load-lock chamber 130, the wafer W is delivered to the transfer module 60 from the atmospheric transfer chamber 140 side, and the gate valve 133 on the atmospheric transfer chamber 140 side is closed. In addition, the transfer module 60 is moved such that the periphery of the wafer W is located on an optical path of the wafer sensor 6.

Then, while the interior of the load-lock chamber 130 is switched to a vacuum atmosphere, the transfer module 60 is rotated about a vertical axis in-situ. As a result, the wafer W rotates about the central axis passing through its center, and alignment is performed while the position of the periphery of the rotating wafer W is detected.

With this configuration, the installation of the alignment chamber 150 illustrated in FIG. 1 may be omitted, which makes it possible to miniaturize the wafer processing system 100. Further, since the alignment can be performed while the interior of the load-lock chamber 130 is switched to a vacuum, the number of wafers W processed per unit time can be increased compared to, for example, an example in which the wafers W are transferred to the alignment chamber 150 where the alignment is performed. The wafer sensor 6 may be installed in the movement region of the transfer module 60, such as the atmospheric transfer chamber 140 or the vacuum transfer chamber 120. The alignment may be performed at each installation location.

The above-described transfer module 60 also corresponds to a substrate transfer module of the present example, and may transfer the wafer in the vacuum transfer chamber 120 instead of or together with either of the above-described first and second transfer modules 20 and 30. In this case, the lifting pins 41 of the placement parts 4 are arranged at positions where the bottom surface of the wafer W can be supported around the column portion 62.

In addition, each of the above-described transfer modules 20, 30, and 60 may be provided with an accelerometer or a thermometer to detect vibration of the wafer W during transfer or to detect an increase in temperature of the wafer W. For example, a measured value of acceleration or temperature may be transmitted to the controller 9. A breakdown of the transfer module 20, 30, or 60 may be self-diagnosed, for example, when the measured acceleration value exceeds a threshold value or when the measured temperature value exceeds a threshold value. Further, an abnormality in processing process of the wafer W may be detected when the measured temperature value of the wafer W exceeds a threshold value.

In addition, for example, a camera configured to monitor the interior of the vacuum transfer chamber 120 may be provided on the first transfer module 20 of a disk shape. For example, by capturing an image of the interior of the vacuum transfer chamber 120, it is possible to identify whether or not an abnormality in the vacuum transfer chamber 120 has occurred. The first transfer module 20 may enter into the wafer processing chamber 110 to capture an image of the interior of the wafer processing chamber 110 and to identify an abnormality. For example, the accuracy of teaching or transfer of the wafer W may be identified by capturing the stage 112 and the wafer W placed on the stage 112 and identifying the position of the wafer W and the position of the stage 112. In addition to the camera, a laser displacement meter or an encoder may be installed to further improve the accuracy in position identification.

In addition, a capturing module that is movable in the vacuum transfer chamber 120 by magnetic levitation may be provided separately from the above-described transfer modules 20, 30, and 60, and a camera may be installed on the capturing module.

Figure 20:
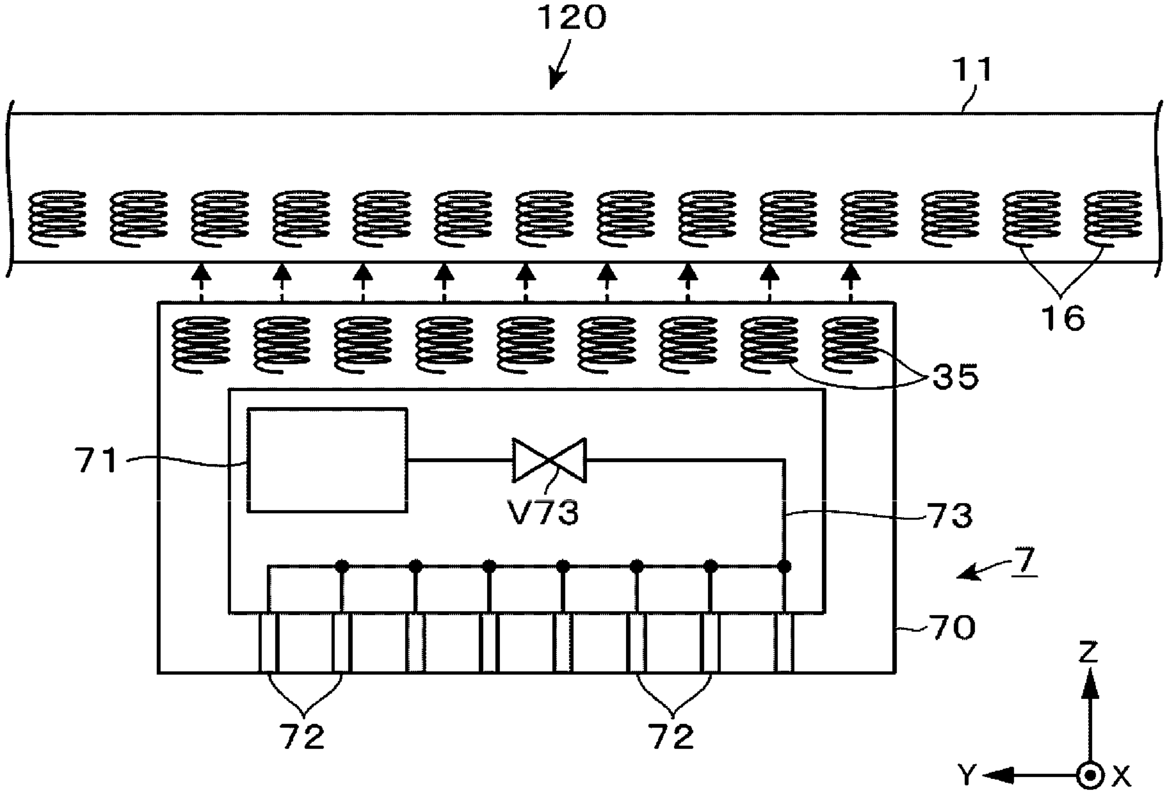
FIG. 20 is a vertical cross-sectional view illustrating a gas supply module that moves on a ceiling surface.
Figure 21:
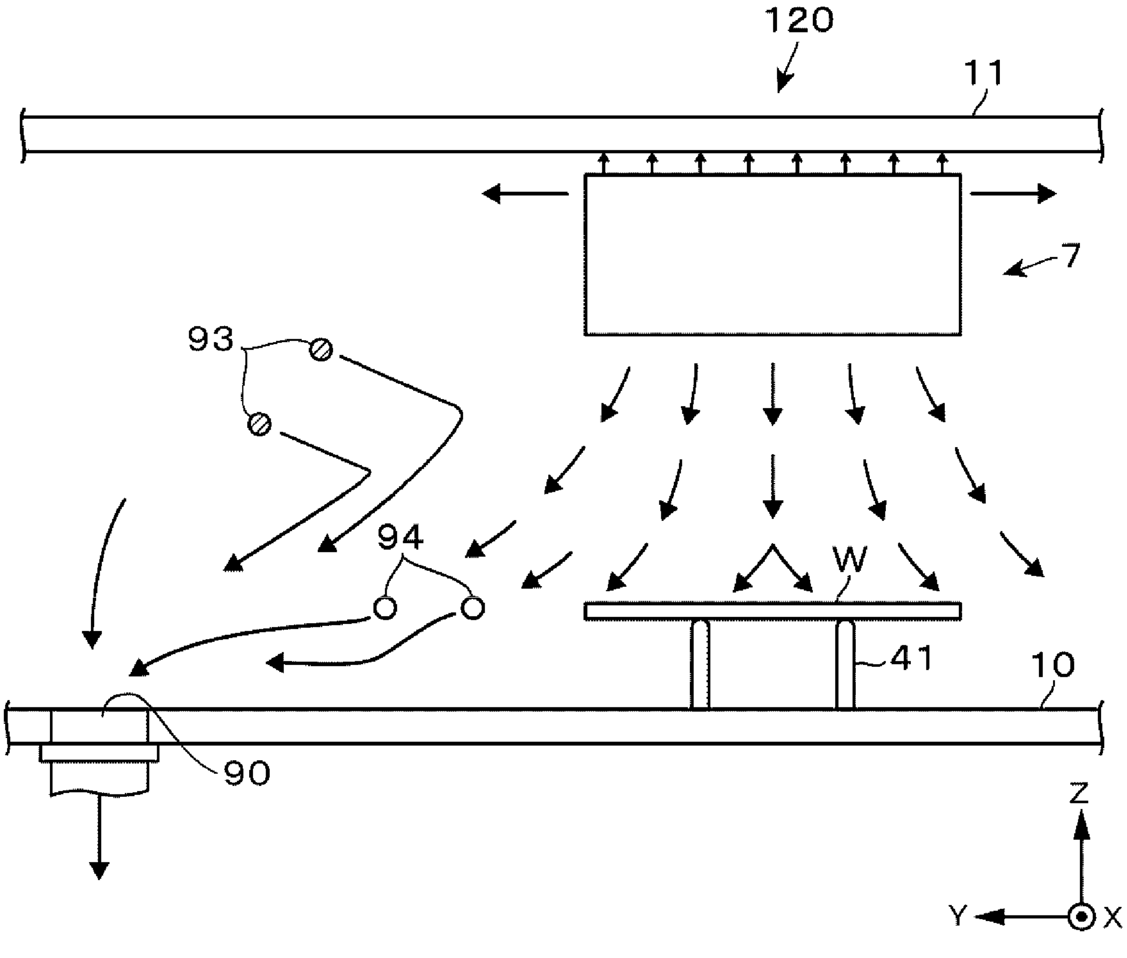
FIG. 21 is a schematic view illustrating an operation of the gas supply module.

Next, FIGS. 20 and 21 illustrate an example in which magnets are provided on the ceiling (ceiling surface) side of a substrate transfer chamber (e.g., the above-described vacuum transfer chamber 120) in which the wafer W is transferred and a module that moves along the ceiling by magnet attraction is provided. A gas ejection module 7 will be described as an example of such a module.

As illustrated in FIG. 20, the gas ejection module 7 includes a housing 70. Inside the housing 70, there is provided a gas reservoir 71 in which, for example, a nitrogen ($N_2$) gas, which is a cleaning gas, is stored.

In addition, a plurality of gas ejection holes 72 are formed in a bottom surface side of the housing 70 and configured such that the $N_2$ gas stored in the gas reservoir 71 is ejected from the gas ejection holes 72 via a pipe 73. In FIG. 20, V73 indicates a valve provided in the pipe 73.

Module-side coils 35 are provided in a ceiling plate of the housing 70, and ceiling surface-side coils 16 are installed on a ceiling surface 11 of the vacuum transfer chamber 120. The ceiling surface-side coils 16 correspond to a third magnet, and the module-side coil 35 corresponds to a fourth magnet. Then, the module-sides coils 35 and the ceiling surface-side coils 16 magnetically attract the gas ejection module 7 below the ceiling surface 11 in the vacuum transfer chamber 120 by magnetic attraction.

The gas ejection module 7 configured as described above ejects the $N_2$ gas, for example, while moving in the vacuum transfer chamber 120 as illustrated in FIG. 21. As a result, a downward flow of a cleaning gas is formed toward the wafer W in the vacuum transfer chamber 120. By this downward flow, particles 93 drifting in the vacuum transfer chamber 120 and corrosive gas 94 generated during processing in the wafer processing chamber 110 can be suppressed from adhering to the wafer W, and can be exhausted from an exhaust port 90 together with the flow of the $N_2$ gas.

Further, while the transfer module 20 or 30 is transferring the wafer W, the gas ejection module 7 may be moved following the transfer module 20 or 30 so as to continuously eject the $N_2$ gas onto the wafer W held by the transfer module 20 or 30.

With this configuration, the wafer W under transfer can be covered with the $N_2$ gas, and the wafer W can be prevented from being oxidized by a gas drifting in a transfer path.

In addition, a temperature control module that houses a heater or the like may be used as a module that is provided on the ceiling surface side and moves. For example, together with the wafer W transferred by the first transfer module 20 that moves along the floor, by positioning and moving the temperature adjustment module disposed above the wafer W, the temperature of the wafer W can be adjusted while the wafer W is being transferred. In addition, a module that moves along the ceiling may be provided with a shelf-like wafer placement part, and the wafers W may be transferred by using the module.

Figure 22:
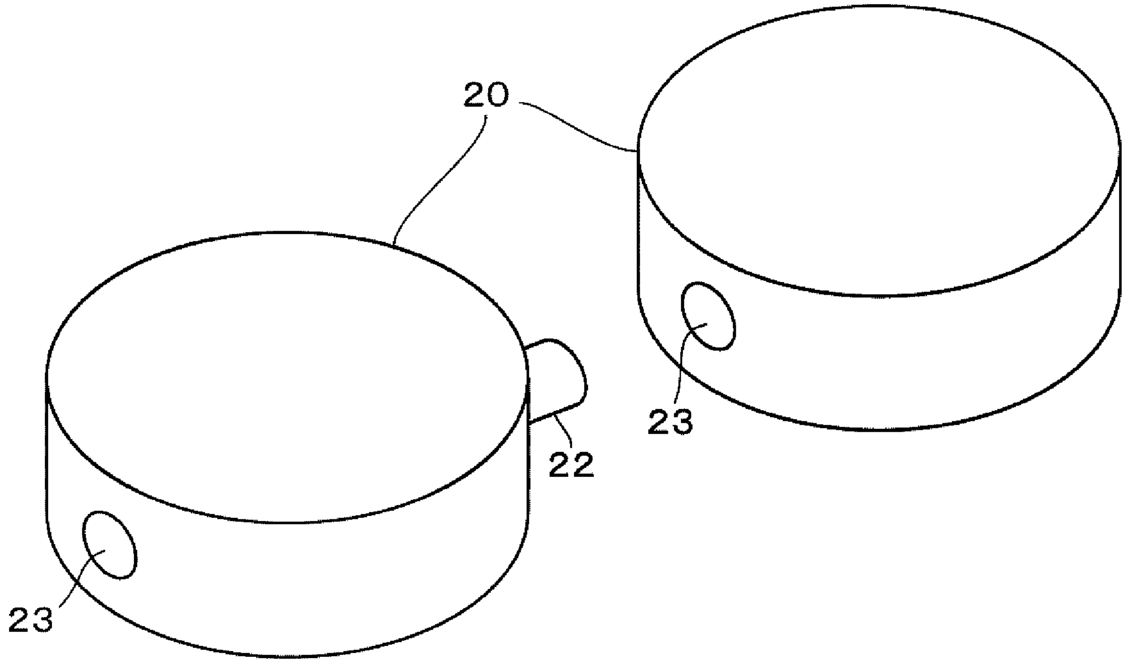
FIG. 22 is a perspective view illustrating a first transfer module including a connection mechanism.
Figure 23:
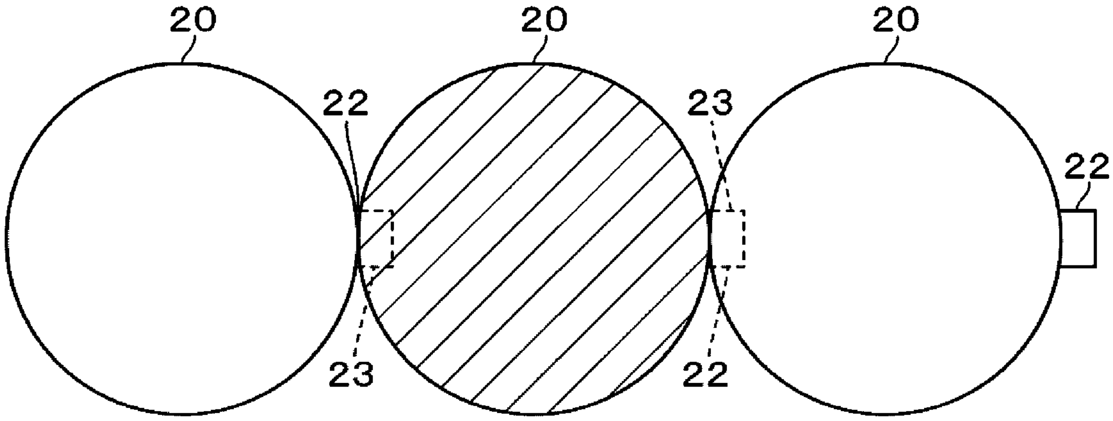
FIG. 23 is a schematic view illustrating transferring the first transfer module that is faoled.

Further, a connection mechanism may be provided to connect the transfer modules 20, 30, and 60 to one another. For example, FIG. 22 illustrates an example in which a protrusion 22 is provided on a side surface of the first transfer module 20. A recess 23 into which the protrusion 22 may be inserted is provided on the side surface opposite to the protrusion 22. Then, as illustrated in FIG. 23, the protrusions 22 of the first transfer modules 20 are configured to be inserted into and connected to respective recesses of other first transfer modules 20. The protrusions 22 and the recesses 23 constitute a connection mechanism.

With this configuration, for example, when the first transfer module 20 breaks down and becomes immovable, other first transfer modules 20 are connected to the broken first transfer module 20 while the broken first transfer module 20 is interposed between the other first transfer modules 20. The first transfer module 20 hatched in FIG. 23 indicates the broken first transfer module 20. With this configuration, the broken first transfer module 20 can be transferred by the other first transfer modules 20.

Figure 24:
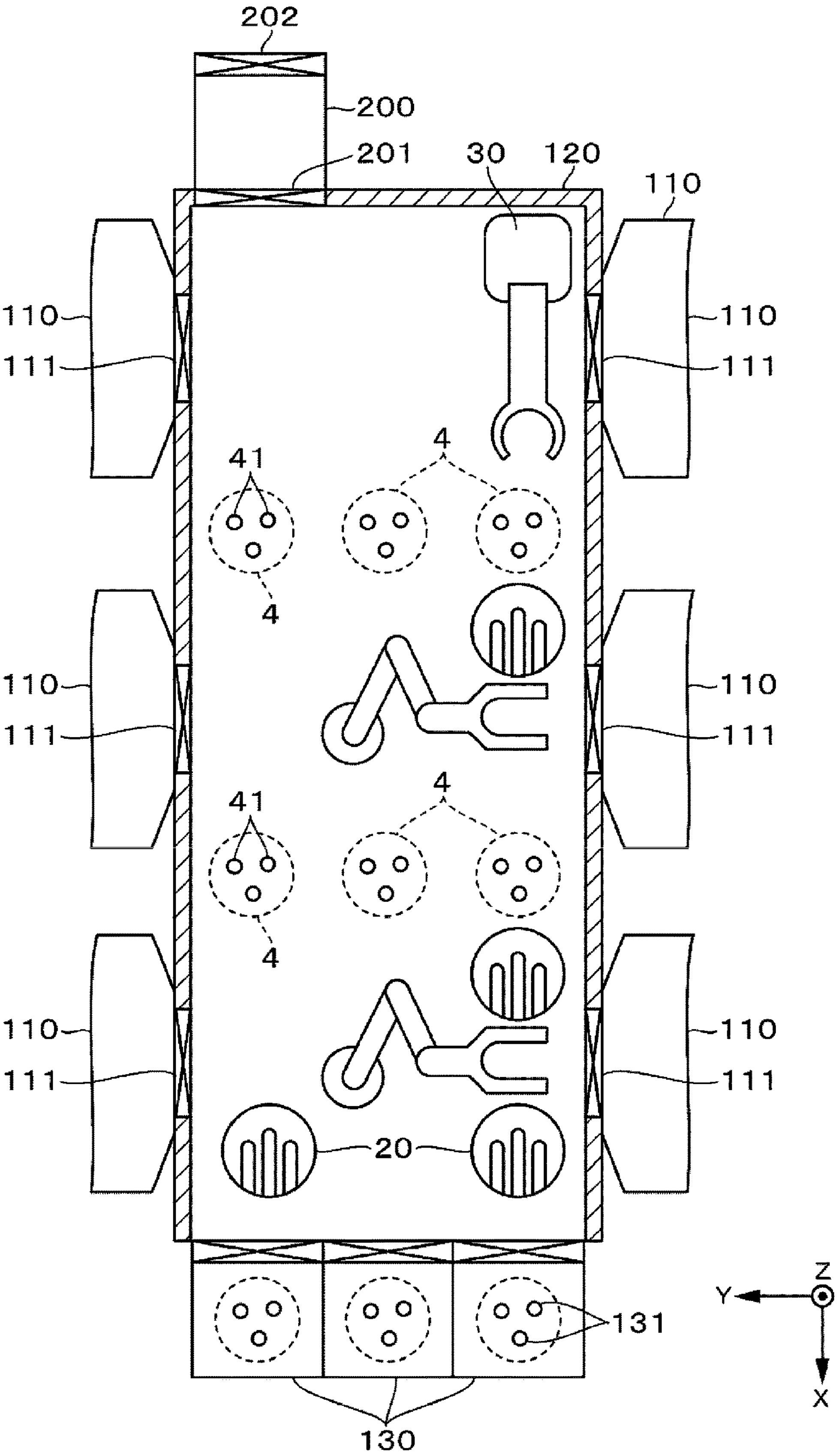
FIG. 24 is a plan view illustrating a wafer processing system including a load-lock chamber for recovery.

Further, a dedicated load-lock chamber 200 capable of switching the internal atmosphere between an air atmosphere and a vacuum atmosphere may be provided to unload the broken first transfer module 20. FIG. 24 illustrates an example in which a load-lock chamber 200 is provided on a rear sidewall portion of the vacuum transfer chamber 120. Reference numeral 201 in FIG. 24 denotes a gate valve, and reference numeral 202 denotes an outlet of the first transfer module 20. By providing the load-lock chamber 200 for recovering the broken transfer module 20, 30, or 60 in this way, the wafer processing system 100 does not need to be stopped and opened, which makes it possible to reduce downtime of the wafer processing system 100. In addition, from the load-lock chamber 200, the wafer W in which an abnormality has occurred may be recovered.

Further, the above-described load-lock chamber 200 may be used as an accommodation chamber for storing transfer modules 20, 30, and 60 that are not in use. The number of transfer modules 20, 30, and 60 used in the vacuum transfer chamber 120 may be adjusted depending on the throughput of the processing performed in the wafer processing system 100. Further, the number of transfer modules 20, 30, and 60 disposed in the vacuum transfer chamber 120 may be increased or decreased via the load-lock chamber 200.

Figure 25:
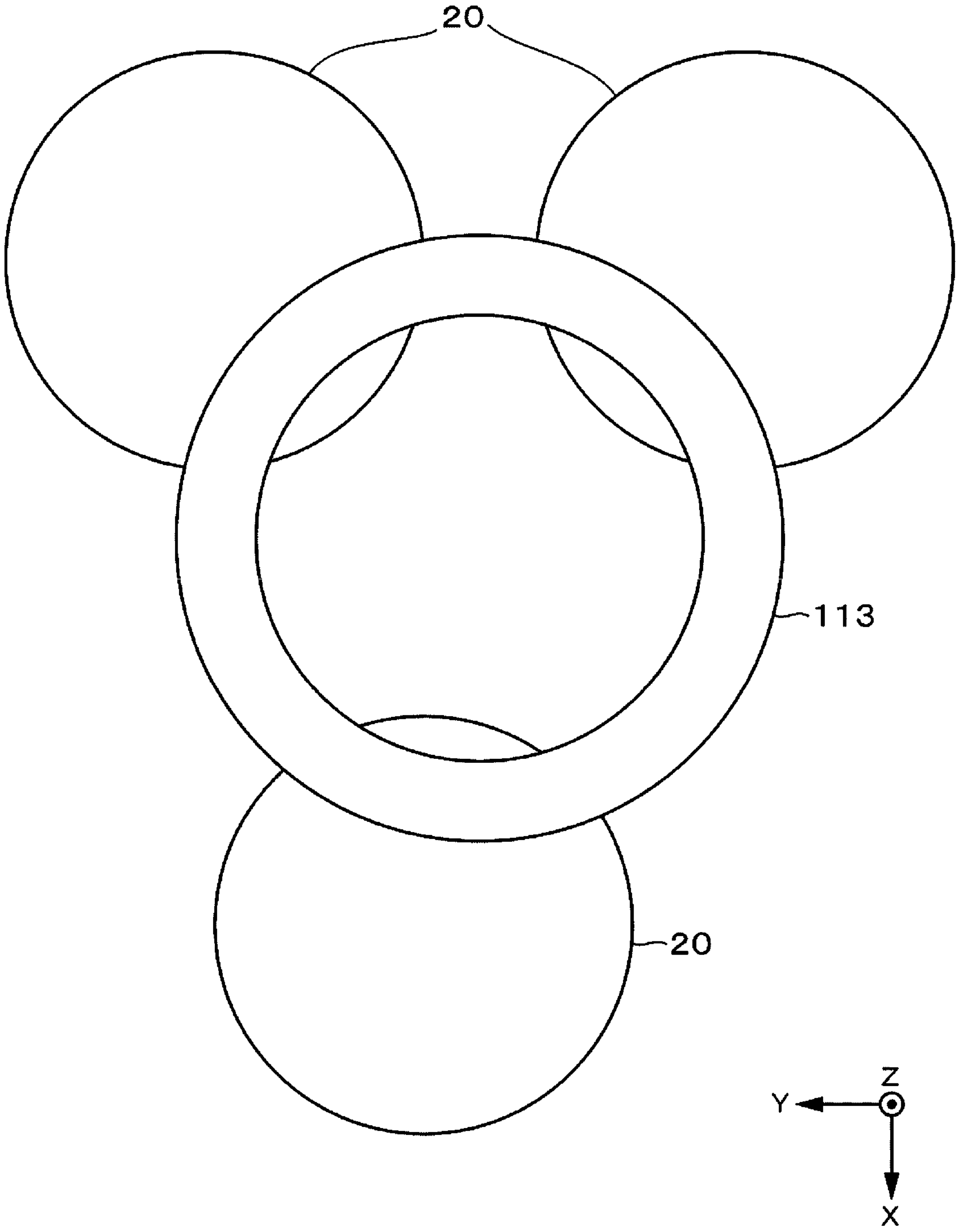
FIG. 25 is a schematic view illustrating transferring a component to be installed in an apparatus by the first transfer module.

Further, the transfer modules 20, 30, and 60 may be used to transfer components to be installed in the vacuum transfer chamber 120 or the wafer processing chambers 110. FIG. 25 illustrates an example of transferring a focus ring 113 by first transfer modules 20. For example, the wafer transfer arm 5 may receive the focus ring 113 from the first transfer modules 20, load the focus ring 113 into the wafer processing chamber 110, and install the focus ring 113 on the stage 112. With this configuration, an internal component or member may be replaced and installed without opening the wafer processing chamber 110.

The first transfer modules 20 may be configured to have a rectangular planar shape. On the other hand, by using the transfer modules 20 having a circular planar shape, an area required for rotation of the transfer modules 20 can be reduced, and an area of the vacuum transfer chamber 120 can be reduced.

Further, the delivery of the wafer W between the first transfer module 20 and the wafer transfer arm 5 may be performed directly between the first transfer module 20 and the wafer transfer arm 5 without using the placement part 4. In this case, for example, lifting pins that move up and down from the surface of the stage 2 of the first transfer module 20 are provided. Then, the lifting pins may be used to raise/lower the wafer W placed on the first transfer module 20 to deliver the wafer to and from the wafer transfer arm 5.

In addition, the number and layout of wafer processing chambers 110 disposed in the vacuum transfer chamber 120 are not limited to the example illustrated in FIG. 1. The number of wafer processing chambers 110 disposed in the vacuum transfer chamber 120 may be increased or decreased as needed. For example, the case in which only one wafer processing chamber 110 is provided in the vacuum transfer chamber 120 is also included in the technical scope of the present disclosure.

Regarding the arrangement of the vacuum transfer chamber 120 as well, the vacuum transfer chamber 120 having a rectangular planar shape is not limited to the case in which the long sides of the vacuum transfer chamber 120 are arranged in the front-rear direction as illustrated in FIG. 1. For example, the vacuum transfer chamber 120 may be arranged with the long sides being oriented in the left-right direction when viewed from the side of the load ports 141.

In addition, regarding the planar shape of the vacuum transfer chamber 120 as well, various shapes may be adopted depending on the shape of the area in which the wafer processing system 100 is arranged. For example, the planar shape may be a square, a polygon with five sides or more, a circle, or an ellipse.

In addition, the substrate transfer chambers in which the wafers W are transferred to the wafer processing chambers 110 by using the transfer modules 20, 30, and 60 are not limited to the case in which the substrate transfer chamber is constituted with the vacuum transfer chamber 120 whose interior is kept in a vacuum atmosphere. The transfer modules 20, 30, and 60 of the present disclosure may also be applicable to a wafer processing system in which the wafer processing chamber 110 is provided on a side of a substrate transfer chamber whose interior is kept in an atmospheric pressure atmosphere. In this case, providing the wafer processing system with the load-lock chamber 130 is not essential, and the wafer W taken out from the carrier C into the atmospheric transfer chamber 140 may be directly loaded into the substrate transfer chamber.

Figure 26:
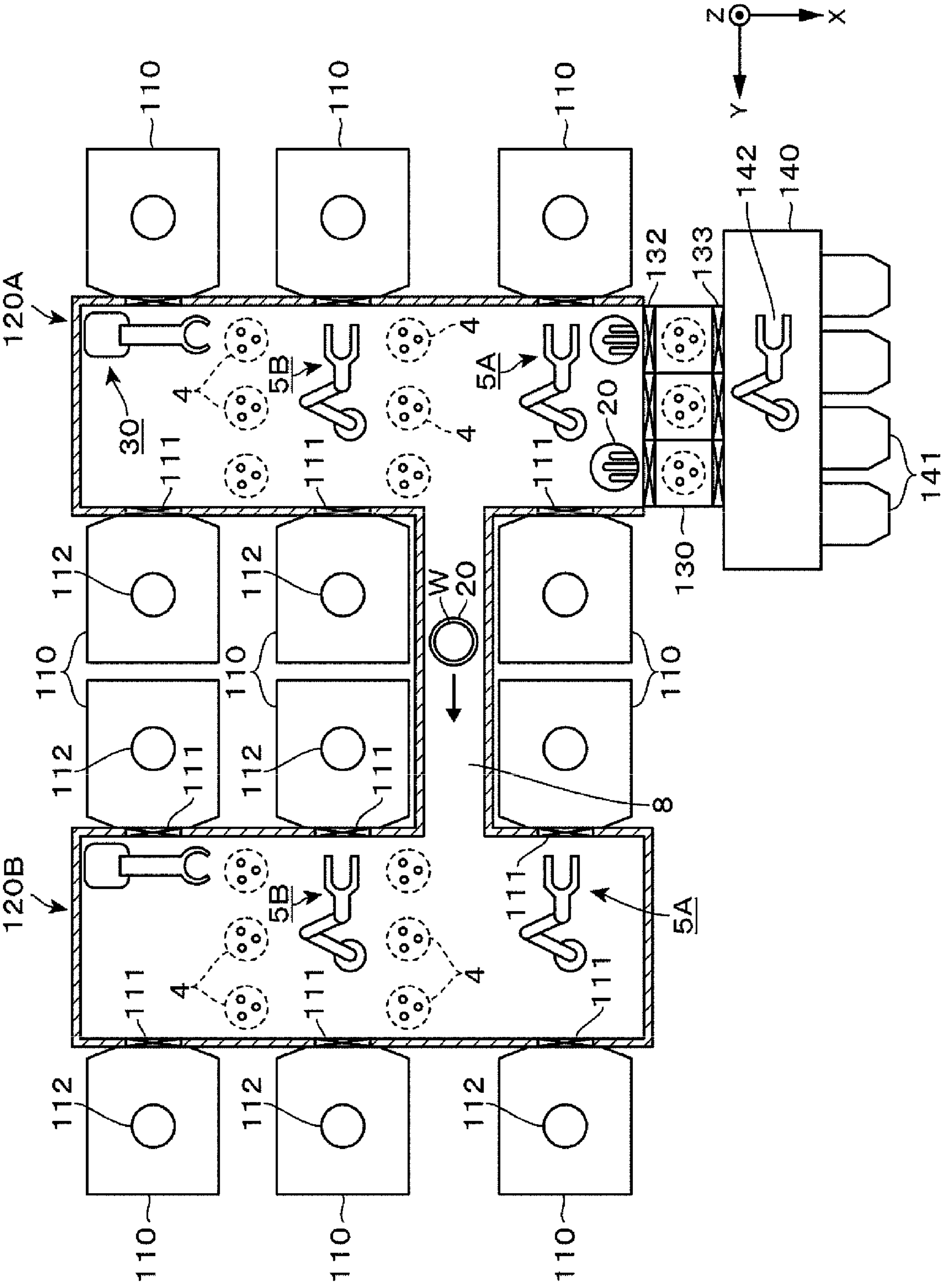
FIG. 26 is a plan view of a wafer processing system in which a plurality of vacuum transfer chambers are connected to each other.

In addition, for example, a vacuum transfer chamber 120A and another vacuum transfer chamber 120B may be connected to each other by a communication path 8. For example, as illustrated in FIG. 26, one end of a communication path 8 is connected to a left side of the vacuum transfer chamber 120A, and the other end of the communication path 8 is connected to a right side of another vacuum transfer chamber 120B. The vacuum transfer chamber 120B has the same configuration as the vacuum transfer chamber 120A except that the load-lock chambers 130 are not provided on the front side.

In addition, the floor-side coils 15 are also installed on a floor of the communication path 8 so that the transfer modules 20, 30, and 60 can move through the floor-side coils 15. By connecting a plurality of vacuum transfer chambers 120A and 120B in this way, the load-lock chamber 130, the atmospheric transfer chamber 140, and the load port 141 may be shared.

In addition, when, for example, only the wafer transfer arm 5 is employed as a wafer transfer mechanism that fixes the space between the vacuum transfer chambers 120A and 120B to the bottom surface, a large space for turning is required. In addition, since a transferable distance is limited, it may be necessary to provide a plurality of transfer mechanisms for transferring to a distant point.

In contrast, when the first and second transfer modules 20 and 30 that float and move by the magnetic force are used, the range in which the floor-side coils 15 can be installed can be relatively freely adjusted. As a result, the range in which one transfer module 20, 30, or 60 is movable can be freely set, so that a degree of freedom in apparatus design is increased.

Without providing a fixed transfer mechanism in the vacuum transfer chamber 120, the wafers W may be levitated by the magnetic force and transferred in the vacuum transfer chamber 120 only by the transfer modules 20, 30, and 60.

Figure 27:
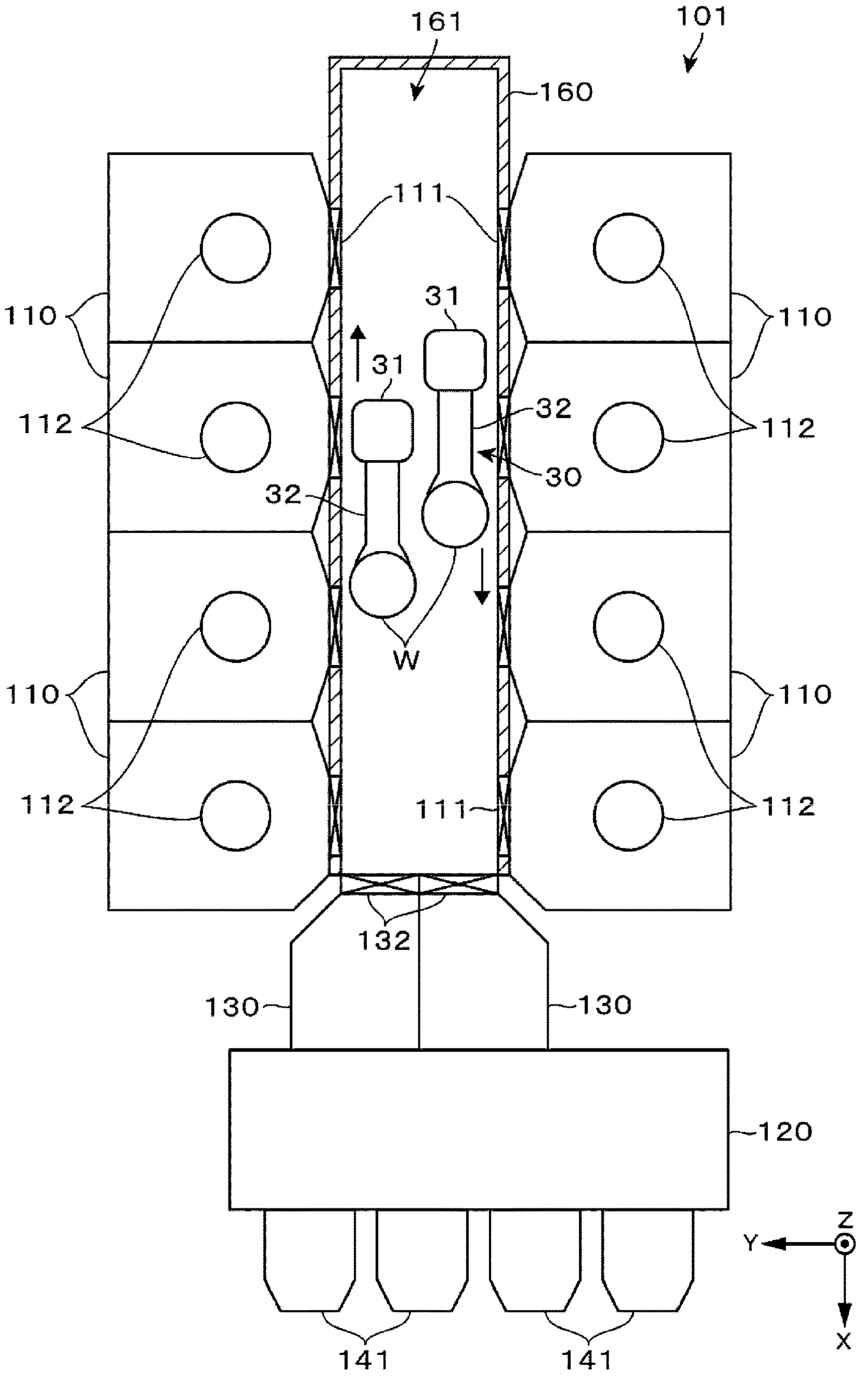
FIG. 27 is a plan view illustrating another example of the wafer processing system.

FIG. 27 illustrates a wafer processing system 101 in which wafers W are transferred by using only the above-described second transfer module 30 (hereinafter, also simply referred to as "transfer module 30"). In this wafer processing system 101, each length in the short side direction of a rectangular vacuum transfer chamber 160 in a plan view forms a width that allows two transfer modules 30, each of which holds a wafer W, to pass therethrough in a state of being aligned side by side. In addition, the length of the vacuum transfer chamber 160 in the short side direction in this example is smaller than the length from the main body portion 31 to the tip of the wafer W when the transfer module 30 holds the wafer W (the total length of the transfer module 30 in the state of holding the wafer W). In this example, the wafers W are transferred by using two transfer modules 30 provided in the vacuum transfer chamber 160.

In addition, on the front side of the vacuum transfer chamber 160, two load-lock chambers 130 are arranged on the left and right. On each of the left and right sides of the vacuum transfer chamber 160, four wafer processing chambers 110 are arranged. That is, the wafers W will be loaded into the wafer processing chambers 110 in a direction crossing the long side direction of the vacuum transfer chamber 160 (the short side direction). On the other hand, as described above, the length of the vacuum transfer chamber 160 in the short side direction is shorter than the total length of the transfer module 30 in a state of holding the wafer W. Therefore, when the transfer module 30 is used to perform the loading/unloading of the wafer W, it is necessary to perform a transition operation in which a linear movement along the long side direction of the vacuum transfer chamber 160 and a curvilinear movement for entering into or retreating from the vacuum transfer chamber 160 while changing the orientation of the transfer module 30 are combined.

Therefore, on the rear side of the vacuum transfer chamber, a space 161 is provided for performing the transition operation at the time of switching the transfer module 30 when the wafer W is loaded into the wafer processing chamber 110 in the rearmost stage. That is, the space 161 is provided to protrude beyond the wafer processing chambers 110 in the rearmost stage (specifically, the positions of the gate valves 111 of the wafer processing chambers 110 in the rear stage). When the wafers W are loaded into/unloaded from the wafer processing chambers 110 on the front side other than the rearmost stage, the above-described transition operation may be performed using a space that expands on the front side of the above-described space 161 in the vacuum transfer chamber 160.

In this wafer processing system 101, the transfer modules 30 move on left and right tracks when viewed from the front side along the long side direction of the vacuum transfer chamber 160 in a posture in which arm portions 32 are directed toward the load-lock chambers 130 (the front side) within the vacuum transfer chamber 160.

The operation of delivering the wafer W to and from the wafer processing chamber 110 in the wafer processing system 101 will be described by taking, as an example, the wafer processing chamber 110 in the left rearmost stage.

First, when receiving the wafer W from the left load-lock chamber 130, the transfer module 30 moves rearward toward the rear side as it is in a posture in which the arm portion 32 is directed toward the front side (see also an arrow indicating a traveling direction illustrated together with the transfer module 30 on the left side when viewed from the front side in FIG. 27).

Then, the transfer module 30 holding the wafer W moves to a position where the gate valve 111 of the wafer processing chamber 110 in the rearmost stage is provided. At this time, the main body portion 31 of the transfer module 30 passes through the position where the gate valve 111 is disposed and reaches the space 161 on the rear side. By this operation, the tip side of the arm portion 32 holding the wafer W is disposed in the vicinity of the gate valve 111.

Figure 28:
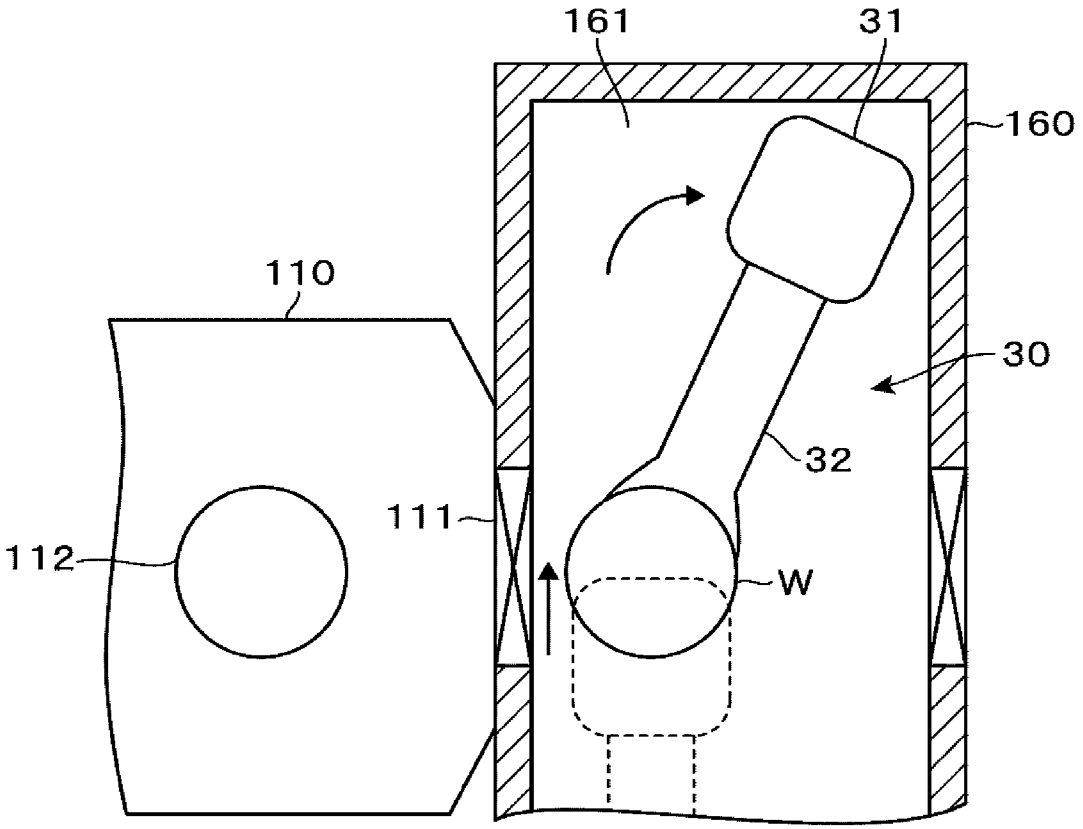
FIG. 28 is a first operational view relating to an operation of a transfer module in the wafer processing system.

In this way, when the tip side of the arm portion 32 reaches the vicinity of the gate valve 111, as illustrated in FIG. 28, in addition to the retreating operation, the arm portion 32 rotates clockwise such that the tip side of the arm portion 32 faces the gate valve 111.

Figure 29:
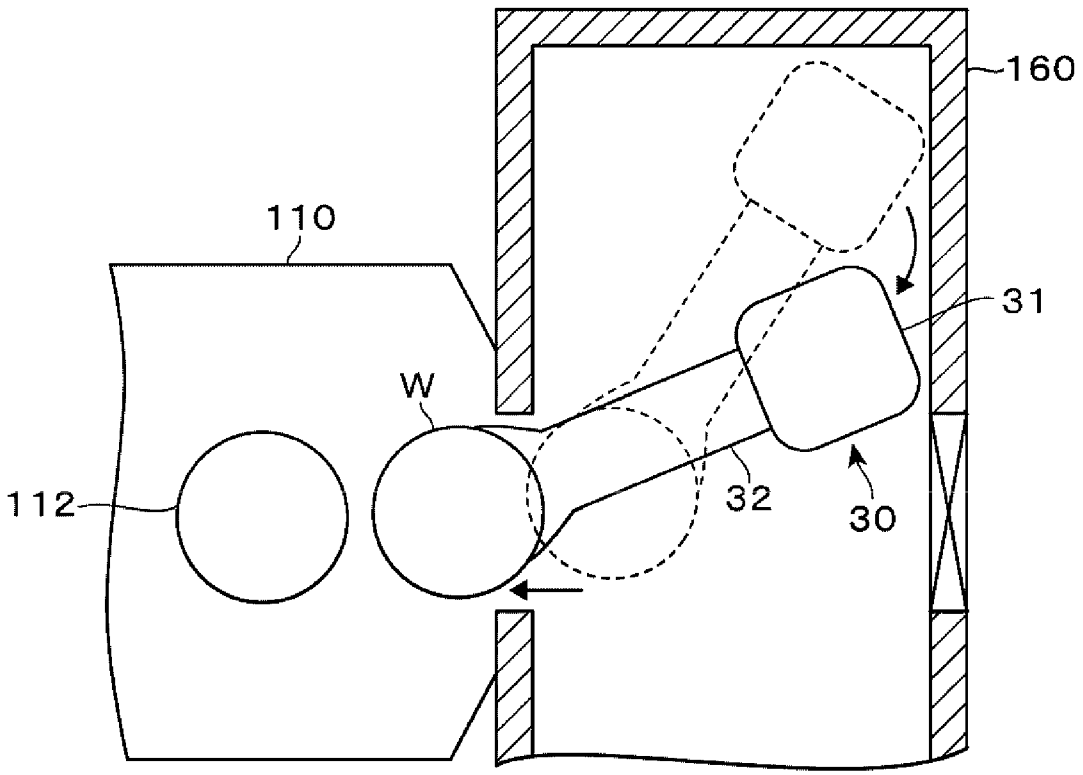
FIG. 29 is a second operational view relating to the operation of the transfer module in the wafer processing system.

Subsequently, the gate valve 111 is opened, and the movement direction of the transfer module 30 is switched to a forward movement while rotating to insert the wafer W into the wafer processing chamber 110 (FIG. 29). Thereafter, when the transfer module 30 is in the state of directly facing the wafer processing chamber 110, the transfer module 30 stops the rotation and moves linearly until the wafer W reaches the upper side of the stage 112.

Figure 30:
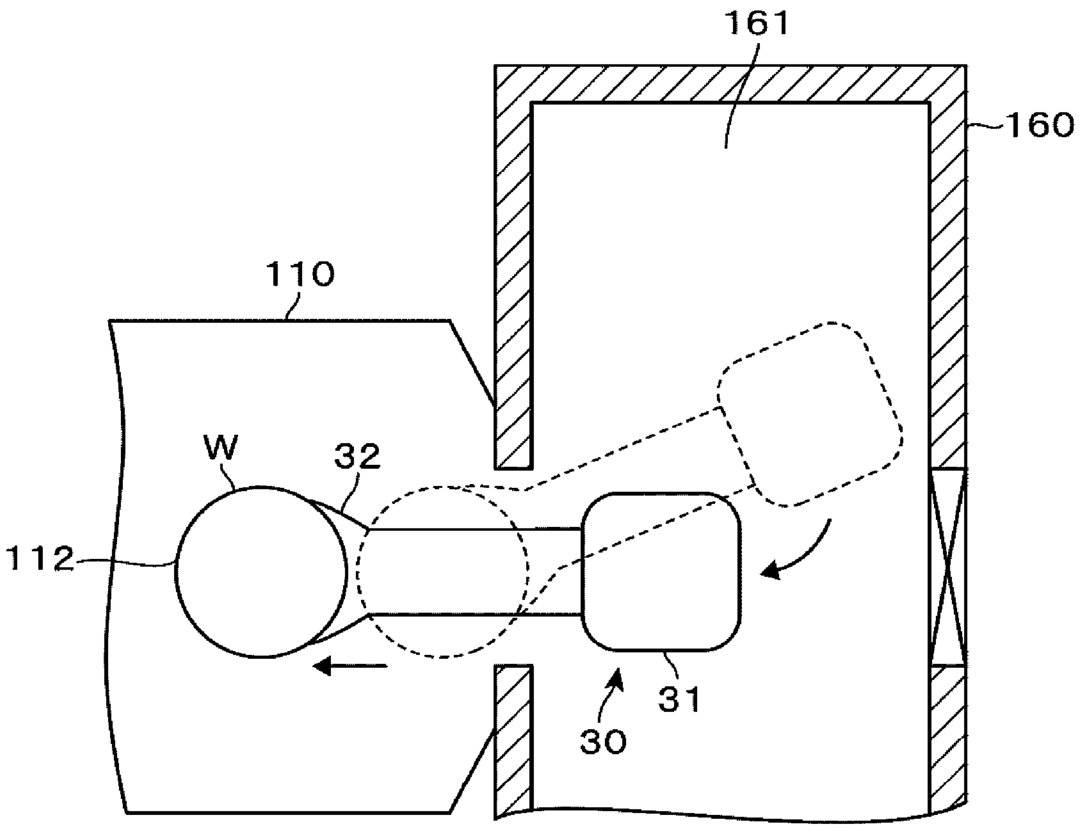
FIG. 30 is a third operational view relating to the operation of the transfer module in the wafer processing system.

By the above-described transition operation in which the above-described transfer module 30 is switched between the rearward movement and the forward movement while rotating, the transfer module 30 takes a posture in which the arm portion 32 is directed to the left side when viewed from the front side (FIG. 30). Then, the wafer W is delivered to the stage 112 and the transfer module 30 is retreated from the wafer processing chamber 110. In addition, the gate valve 111 is closed, and the wafer W is processed.

Then, when the processing of the wafer W is terminated and the wafer W is unloaded from the wafer processing chamber 110, the transfer module 30 causes the arm portion 32 to enter into the wafer processing chamber 110 again to receive the processed wafer W.

Figure 31:
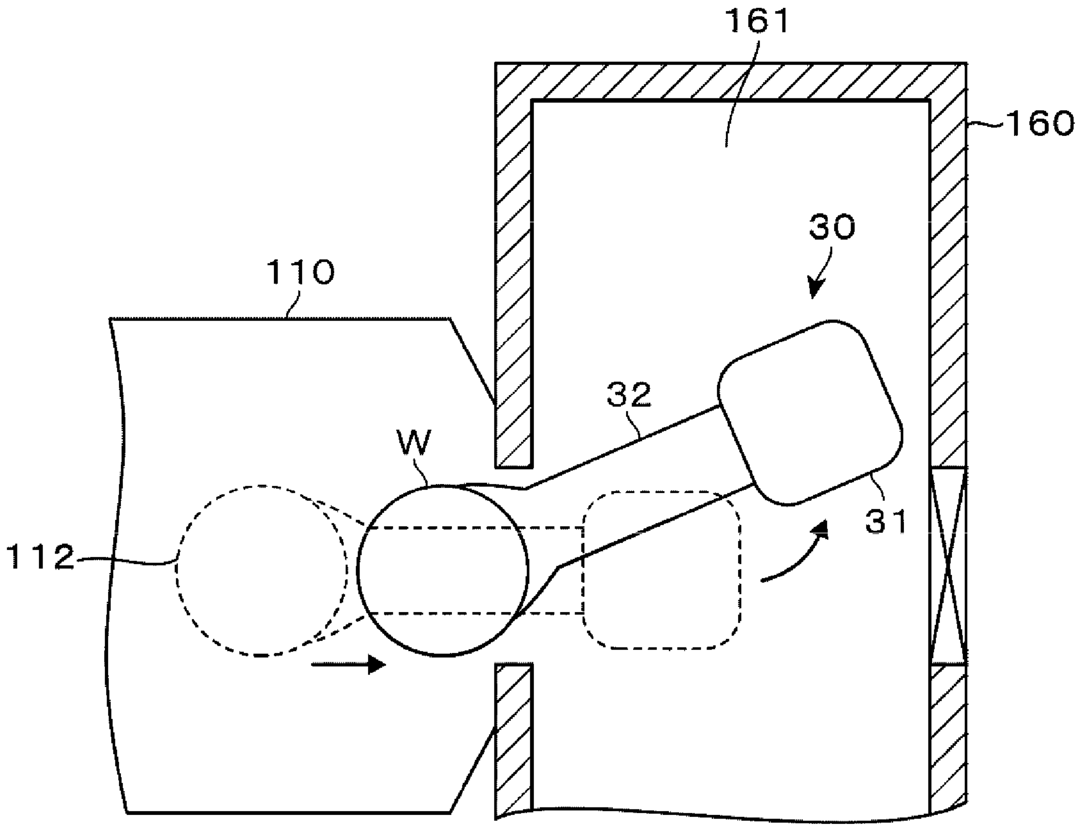
FIG. 31 is a fourth operational view relating to the operation of the transfer module in the wafer processing system.
Figure 32:
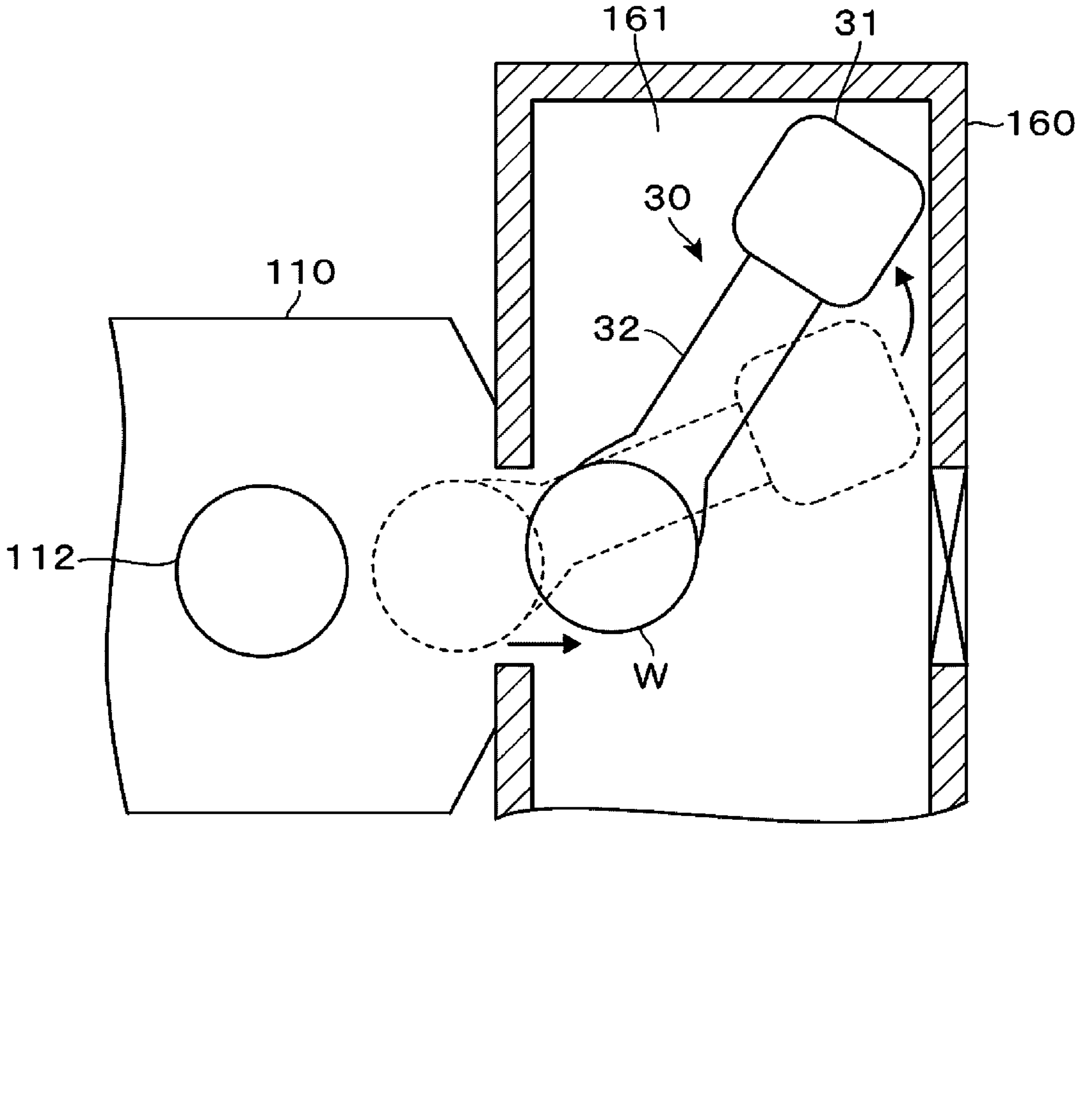
FIG. 32 is a fifth operational view relating to the operation of the transfer module in the wafer processing system.
Figure 33:
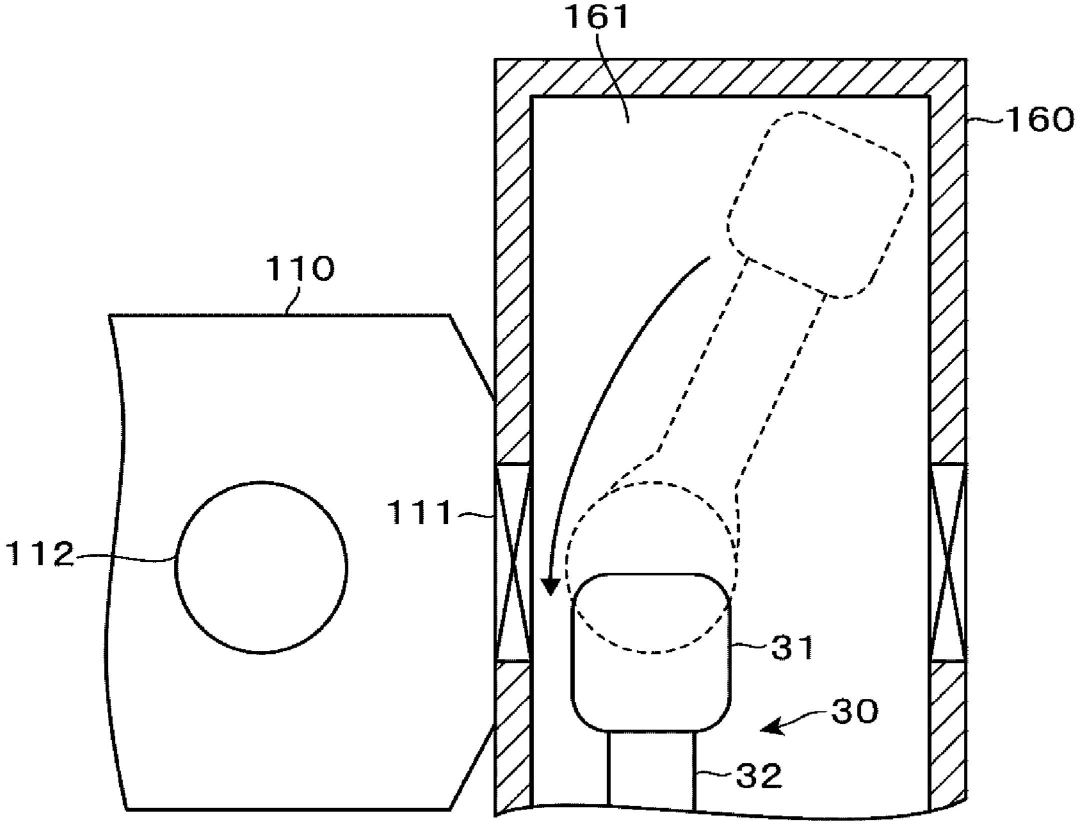
FIG. 33 is a sixth operational view relating to the operation of the transfer module in the wafer processing system.

Then, as illustrated in FIGS. 31 to 33, the transition operation, in which the transfer module 30 is switched between the rearward movement and the forward movement while rotating, is performed in a reverse order of the operation at the time of loading to unload the wafer W. Thereafter, the transfer module moves toward the front side and transfers the wafer W to the left load-lock chamber 130. Although not described in the above-described example, in the operation in which the transfer module 30 causes the arm portion 32, which does not hold the wafer W, to retreat from or enter into the wafer processing chamber 110, the transition operation described above with reference to FIGS. 28 to 33 is also used.

As described above, the space 161 is provided on the rear side of the vacuum transfer chamber 160 to change the direction of the transfer module 30 while performing the transition operation of the transfer module 30. By providing the space 161, a width in the short side direction of the vacuum transfer chamber 160 may be made smaller than the total length of the transfer module 30 in the state of holding the wafer W. Therefore, the area of the floor of the vacuum transfer chamber 160 can be reduced. As described above, for each wafer processing chamber 110 disposed on the front side of the wafer processing chambers 110 in the rearmost stage, the transition operation can be performed using the space that expands on the front side of the space 161 in the vacuum transfer chamber 160.

In addition, since the wafer processing system 101 is not provided with the wafer transfer arms 5 or the placement parts 4 in the vacuum transfer chamber 160, the height dimension of the vacuum transfer chamber 160 can be reduced compared to the case where the wafer transfer arms 5 or the placement parts 4 are provided.

It should be noted that the embodiments disclosed herein are exemplary in all respects and are not restrictive. The above-described embodiments may be omitted, replaced or modified in various forms without departing from the scope and spirit of the appended claims.

EXPLANATION OF REFERENCE NUMERALS

2: stage, 5: wafer transfer arm, 10: floor portion, 15: floor-side coil, 20: first transfer module (transfer module), 30: second transfer module (transfer module), 32: wafer holder, 35: module-side coil, 60: transfer module, 100, 101: wafer processing system, 110: wafer processing chamber, 120, 160: vacuum transfer chamber, W: wafer

What is claimed is:

1. An apparatus that performs a transfer of a substrate to a substrate processing chamber in which a substrate processing is performed, comprising:

a substrate transfer chamber including a floor portion provided with a first magnet, and a sidewall portion connected to the substrate processing chamber and having an opening portion through which a loading/unloading of the substrate between the substrate transfer chamber and the substrate processing chamber is performed; and a substrate transfer module including a substrate holder configured to hold the substrate, and a second magnet configured such that a repulsive force acts between the first magnet and the second magnet, the substrate transfer module being configured to be movable inside the substrate transfer chamber by magnetic levitation based on the repulsive force, wherein the substrate transfer module is configured to perform the loading/unloading of the substrate by directly entering the substrate transfer chamber via the opening portion, or in a case in which a substrate transfer mechanism is fixedly provided inside the substrate transfer chamber to perform the loading/unloading of the substrate between the substrate transfer mechanism and the substrate processing chamber via the opening portion, the substrate transfer module is configured to deliver the substrate to and from the substrate transfer mechanism, wherein, in the case in which the substrate transfer mechanism is provided inside the substrate transfer chamber, the apparatus comprises a substrate delivery part provided inside the substrate transfer chamber and configured to temporarily place the substrate delivered between the substrate transfer module and the substrate transfer mechanism on the substrate delivery part, and wherein the substrate delivery part includes a placement part having three lifting pins for supporting the substrate to form a triangular support surface.

2. The apparatus of claim 1, wherein the substrate transfer mechanism is a substrate transfer arm configured to be extensible and rotatable about a vertical axis, and wherein the opening portion is provided in each of two sidewall portions of the substrate transfer chamber with the substrate transfer arm interposed between the two sidewall portions such that opening portions provided in the two sidewall portions face each other with the substrate transfer arm interposed between the opening portions, and a plural number of the substrate delivery part are arranged along an arrangement of the opening portions and the substrate transfer arm.

3. The apparatus of claim 1, wherein a substrate delivery part-side magnet is configured such that a repulsive force acts between the substrate delivery part-side magnet and the first magnet, and when the substrate is held by the substrate transfer module and when the substrate is held by the substrate transfer mechanism, the substrate delivery part is configured to be rotatable around a vertical axis inside the substrate transfer chamber by magnetic levitation based on the repulsive force to change an orientation of the substrate.

4. The apparatus of claim 1, wherein the substrate transfer chamber includes a ceiling surface portion provided with a third magnet, wherein the apparatus comprises a processing module including a fourth magnet configured such that an attractive force acts between the fourth magnet and the third magnet, and configured to process an interior of the substrate transfer chamber or the substrate, and wherein the processing module is configured to be movable inside the substrate transfer chamber by a magnetic attraction based on the attractive force.

5. The apparatus of claim 4, wherein the processing module is a gas ejection module configured to eject a gas into the substrate transfer chamber via a gas supply hole provided in a bottom surface of the processing module so that a downward flow of a cleaning gas toward the substrate inside the substrate transfer chamber is formed.

6. The apparatus of claim 1, wherein the substrate transfer module includes a connection mechanism configured to connect the substrate transfer module to another substrate transfer module.

7. The apparatus of claim 1, further comprising: an accommodation chamber connected to the substrate transfer chamber and configured to accommodate the substrate transfer module.

8. The apparatus of claim 1, wherein the substrate transfer module is configured to transfer a component installed inside the substrate transfer chamber or the substrate processing chamber in addition to the transfer of the substrate.

9. The apparatus of claim 1, wherein the substrate transfer module is configured to have in a shape of a disk in which the second magnet is provided, and an upper surface of the disk serves as the substrate holder.

10. The apparatus of claim 1, wherein the substrate transfer module includes a main body portion in which the second magnet is provided, and an arm portion extending laterally from the main body portion and having a fork constituting the substrate holder on a tip end of the arm portion.

11. The apparatus of claim 10, wherein the substrate transfer module performs the loading/unloading of the substrate by inserting the arm portion into the substrate processing chamber via the opening portion while the main body portion is positioned inside the substrate transfer chamber.

12. The apparatus of claim 11, wherein the substrate transfer chamber has an elongated rectangular shape in a plan view and is configured such that a length in a short side direction of the elongated rectangular shape is smaller than a total length of the substrate transfer module in a state of holding the substrate, and in the substrate transfer chamber, a space is provided in which a direction of the substrate transfer module is switched while performing a transition operation when inserting and retreating the arm portion into and out of the substrate processing chamber via the opening portion.

13. The apparatus of claim 1, wherein the substrate transfer module includes a main body portion in which the second magnet is provided, and a column portion extending to protrude upward from an upper surface of the main body portion and having an upper surface on which a substrate holding surface serving as the substrate holder is formed.

14. The apparatus of claim 13, wherein the column portion has a diameter smaller than a diameter of the substrate, wherein a sensor configured to optically detect a peripheral portion of the substrate supported by the column portion, which is positioned outward of the column portion, is provided in a region where the substrate transfer module is movable by the first magnet provided in the floor portion, and wherein the substrate transfer module is configured to perform an alignment of the substrate by moving to a position where the peripheral portion of the substrate held on the substrate holding surface is detectable by the sensor and rotating the main body portion around a central axis through which a center of the substrate passes.

15. The apparatus of claim 14, wherein the substrate transfer chamber is configured such that the transfer of the substrate is performed under a vacuum atmosphere, a load-lock chamber is connected to a position different from a position where the opening portion to which the substrate processing chamber is connected is formed in the sidewall portion of the substrate transfer chamber, the load-lock chamber being configured such that an internal pressure of the load-lock chamber is switchable between a normal pressure and a vacuum and a substrate to be loaded into or unloaded from the substrate transfer chamber is temporarily placed in the load-lock chamber, the load-lock chamber includes a region in which the first magnet is provided in the floor portion to move the substrate transfer module, and the sensor and the substrate transfer module for alignment which are arranged in the region, and in a period during which the internal pressure of the load-lock chamber is switched between the normal pressure and the vacuum, the alignment is performed on the substrate loaded into the load-lock chamber.

16. The apparatus of claim 1, wherein the substrate transfer module has a function of self-diagnosing a failure.

17. The apparatus of claim 1, further comprising: a capturing module including a camera configured to capture an image of a movement region where the first magnet is provided, and a magnet for the capturing module configured such that a repulsive force acts between the capturing module and the first magnet, the capturing module being configured to be movable by magnetic levitation based on the repulsive force.

18. A substrate processing system comprising:

the apparatus of claim 1; and a plurality of substrate processing chambers connected to the substrate transfer chamber via a plural number of the opening portion formed in the sidewall portion.

* * * * *